US012690207B2

(12) United States Patent　　　　(10) Patent No.:　US 12,690,207 B2

Radic et al.　　　　　　　　　　　　(45) Date of Patent:　　Jul. 21, 2026

(54) SEMICONDUCTOR DEVICE WITH A MONOCRYSTALLINE EXTRINSIC BASE AND METHOD THEREFOR

(71) Applicant: NXP B.V., Eindhoven (NL)

(72) Inventors: Ljubo Radic, Gilbert, AZ (US); Jay Paul John, Chandler, AZ (US); James Albert Kirchgessner, Tempe, AZ (US); Johannes Josephus Theodorus Marinus Donkers, Valkenswaard (NL)

(73) Assignee: NXP B.V., Eindhoven (NL)

( * ) Notice: Subject to any disclaimer, the term of this patent is extended or adjusted under 35 U.S.C. 154(b) by 378 days.

(21) Appl. No.: 18/059,849

(22) Filed: Nov. 29, 2022

(65) Prior Publication Data

US 2024/0178304 A1　　May 30, 2024

(51) Int. Cl.
　　H10D 10/40　　　　(2025.01)
　　H10D 10/01　　　　(2025.01)
　　H10D 62/17　　　　(2025.01)

(52) U.S. Cl.
　　CPC ............. H10D 10/40 (2025.01); H10D 10/01 (2025.01); H10D 62/177 (2025.01)

(58) Field of Classification Search
　　CPC ...... H10D 10/01; H10D 10/40; H10D 10/421; H10D 10/441; H10D 62/133; H10D 62/136; H10D 62/137; H10D 62/138; H10D 62/177; H10D 10/821; H10D 10/861; H10D 10/021; H10D 10/051; H10D 10/054; H10D 10/056; H10D 64/231; H10D 64/281; H10D 10/80; H10D 10/841; H01L 21/04; H01L 21/331; H01L 21/761; H01L 21/8222; H01L 21/8229; H01L 21/8249; H01L 29/04; H01L 29/0804; H01L 29/0834; H01L 29/1004; H01L 29/1008; H01L 29/0649; H01L 29/0696; H01L 29/41708; H01L 29/42304; H01L 29/66234; H01L 29/66348; H01L 29/66265; H01L 29/66295; H01L 29/66303; H01L 29/66325; H01L 29/66333; H01L 29/66287; H01L 29/66242; H01L 29/73; H01L 29/7378; H01L 29/732;

(Continued)

(56) References Cited

U.S. PATENT DOCUMENTS

| 5,134,454 A | | 7/1992 | Neudeck et al. | |
| 5,591,651 A | * | 1/1997 | Chen .................... | H10D 62/137 |
| | | | | 438/362 |

(Continued)

FOREIGN PATENT DOCUMENTS

| EP | 4310914 A1 | 1/2024 |
| WO | WO-2009158054 A1 | 12/2009 |

*Primary Examiner* — Natalia A Gondarenko

(74) *Attorney, Agent, or Firm* — Bruce M. Green

(57)　　　　　　ABSTRACT

A semiconductor device includes a semiconductor substrate, a collector region formed within the semiconductor substrate in a first semiconductor region having an upper surface and a collector sidewall, a base region disposed over the collector region, a seed region formed over the semiconductor substrate and coupled to the semiconductor substrate outside the base region, an extrinsic base region having an upper surface and formed over the seed region and electrically coupled to the base region, and an emitter region formed over the base region.

18 Claims, 15 Drawing Sheets

(58) Field of Classification Search
 CPC ... H01L 29/735; H01L 29/737; H01L 29/739;
 H01L 29/7398; H01L 29/7325; H01L
 29/0817; H01L 29/7375; H01L 29/7393;
 H01L 29/7395; H01L 29/7397
 USPC ....... 257/565, 401, 117, 129, 526, 557, 575,
 257/576, 558, 581; 438/204, 236, 335
 See application file for complete search history.

(56) References Cited

U.S. PATENT DOCUMENTS

| | | | |
|---|---|---|---|
| 6,541,336 B1 | 4/2003 | Cantell et al. | |
| 6,870,184 B2 | 3/2005 | Li et al. | |
| 7,074,685 B2 | 7/2006 | Magnee et al. | |
| 8,431,966 B2 | 4/2013 | Meunier-Beillard et al. | |
| 8,786,051 B2 | 7/2014 | Adkisson et al. | |
| 9,111,986 B2 | 8/2015 | Camillo-Castillo et al. | |
| 9,240,448 B2 | 1/2016 | Adkisson et al. | |
| 11,018,247 B1 | 5/2021 | Radic et al. | |
| 11,127,816 B2 * | 9/2021 | Adusumilli .......... | H10D 62/116 |
| 2005/0212087 A1 * | 9/2005 | Akatsu ................. | H10D 10/021 |
| | | | 257/E29.034 |
| 2008/0050883 A1 | 2/2008 | Enicks | |
| 2013/0214275 A1 | 8/2013 | Adkisson et al. | |
| 2014/0246676 A1 * | 9/2014 | Camillo-Castillo ......................... | |
| | | | H10D 62/115 |
| | | | 438/312 |
| 2014/0353725 A1 * | 12/2014 | Adkisson ............. | H10D 10/821 |
| | | | 438/318 |
| 2018/0102422 A1 | 4/2018 | Stamper et al. | |

* cited by examiner

Figure 9C:
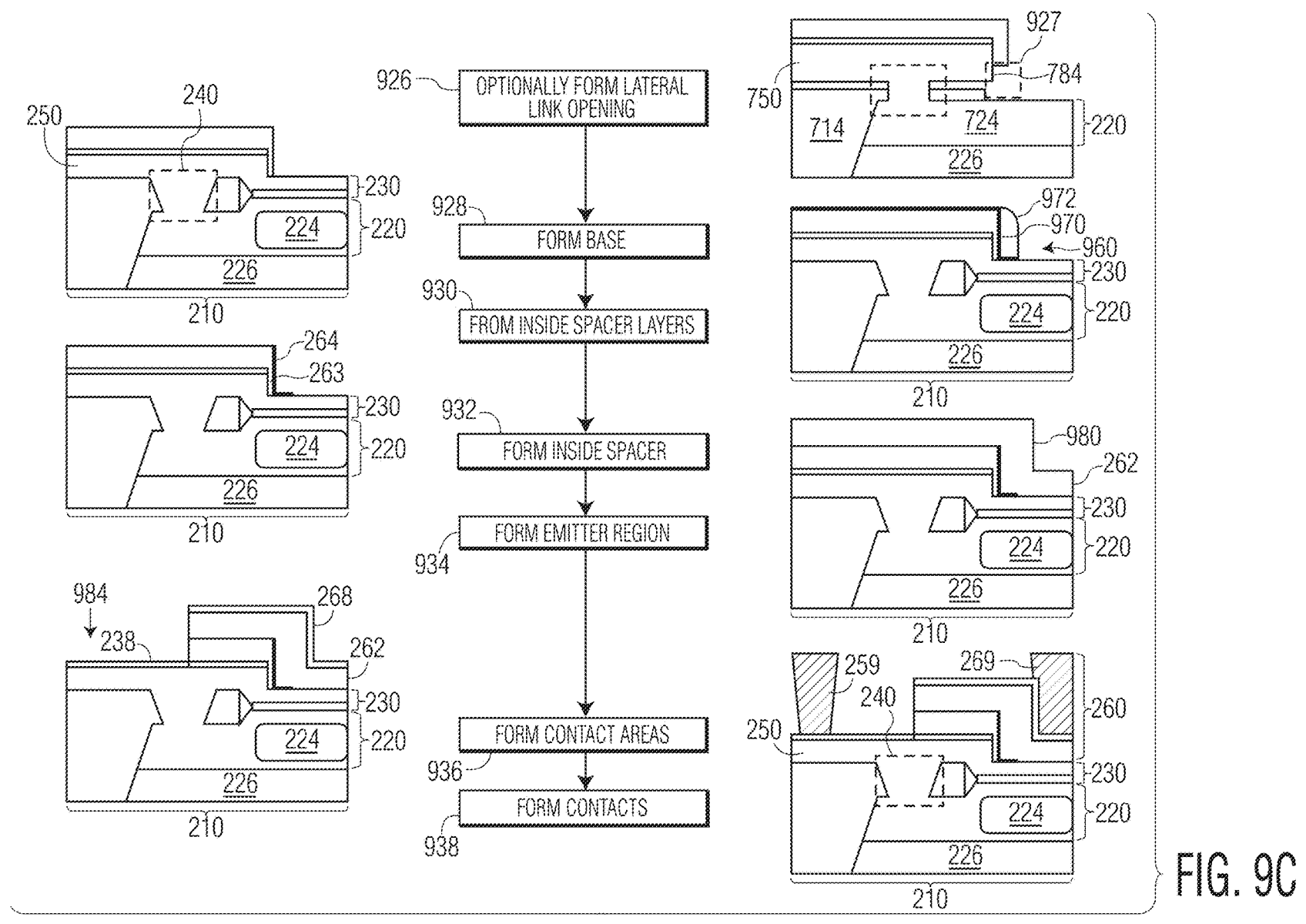

OPTIONALLY FORM LATERAL LINK OPENING

FORM BASE

FROM INSIDE SPACER LAYERS

FORM INSIDE SPACER

FORM EMITTER REGION

FORM CONTACT AREAS

FORM CONTACTS

SEMICONDUCTOR DEVICE WITH A MONOCRYSTALLINE EXTRINSIC BASE AND METHOD THEREFOR

TECHNICAL FIELD

Embodiments of the subject matter described herein relate generally to semiconductor devices, including bipolar junction transistors (BJT's) and heterojunction bipolar transistors (HBT's).

BACKGROUND

Semiconductor devices find application in a wide variety of electronic components and systems. Moreover, useful semiconductor devices for radio frequency (RF), micro- wave, and millimeter wave applications may include BJTs, HBTs, and related devices. HBTs are useful in high fre- quency applications because of their fast transit time, high cutoff frequency, high gain, and good linearity properties. These HBTs act as active gain elements and find applications as active devices in RF, microwave, and millimeter wave power amplifiers, oscillators, and other useful electronic components. In these and other applications for these devices, there is a need for reduced base resistance. Reduced base resistance is important for achieving higher maximum frequency of oscillation ($f_{max}$) and improved frequency response for these applications. The value of $f_{max}$ is inversely proportional to base resistance ($R_b$). Thus, semi- conductor devices, including BJTs and HBTs, with reduced $R_b$ are desired.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 9A, 9B, and 9C are a process flow diagrams with corresponding cross-sectional views describing a method for fabricating the semiconductor devices, in accordance with the embodiment of FIG. 2.

SUMMARY

Figure 1:
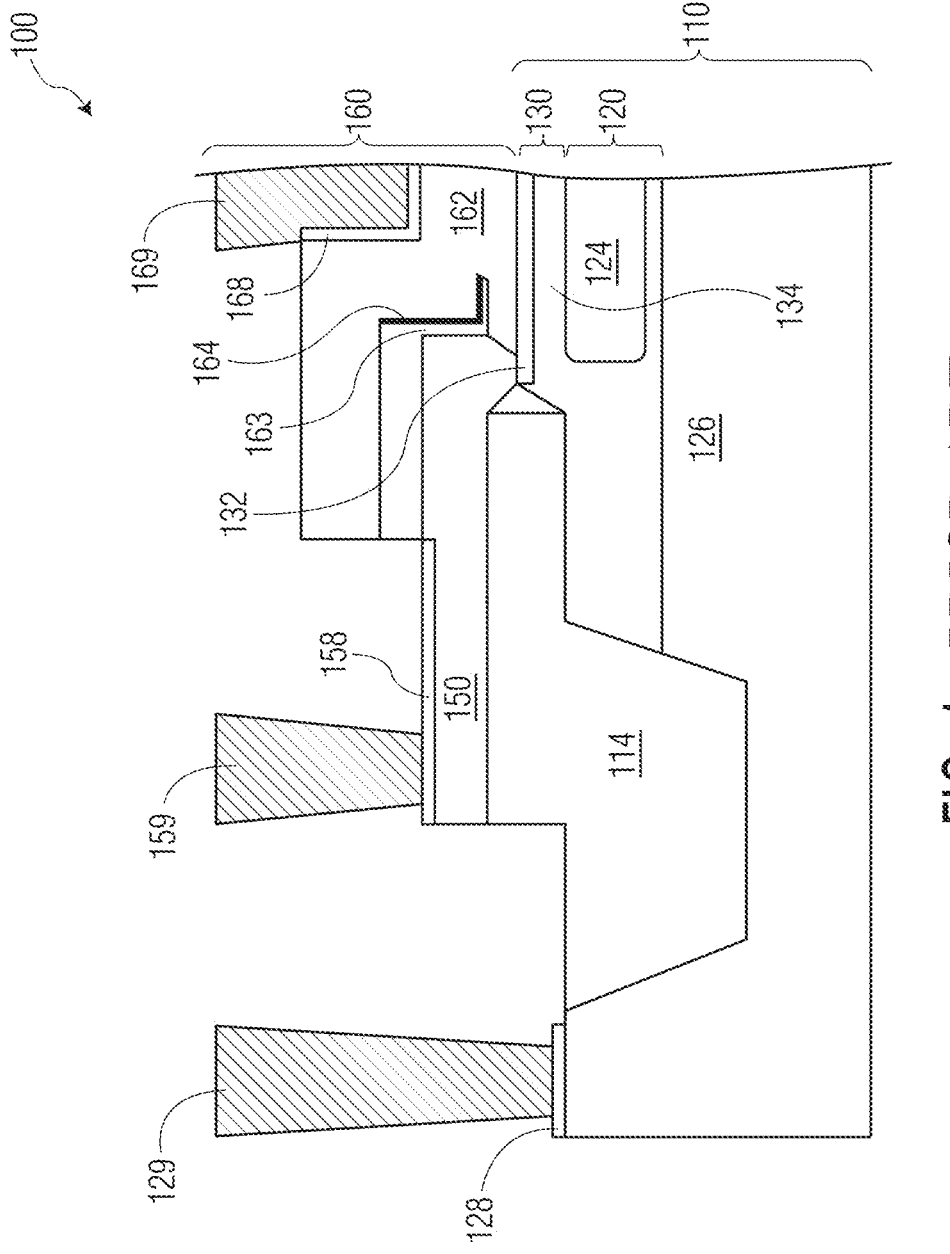
FIG. 1 is a cross sectional side view of a semiconductor device.

In one aspect, an embodiment includes a semiconductor device that may include a semiconductor substrate, a collector region formed within the semiconductor substrate in a first semiconductor region, having an upper surface and a collector sidewall. A base region may be disposed over the collector region, according to an embodiment. In an embodi- ment, a seed region may be formed over the semiconductor substrate and coupled to the semiconductor substrate outside the base region. An extrinsic base region having an upper surface may be formed over the seed region and electrically coupled to the base region, according to an embodiment. In an embodiment, an emitter region may be formed over the base region.

At least a portion of the extrinsic base region may include a monocrystalline material, according to an embodiment.

At least a portion of the extrinsic base region may include silicon germanium, according to an embodiment.

The seed region may be formed in the first semiconductor region, according to an embodiment.

A dielectric region may be formed over at least a portion of the first semiconductor region and over a portion the collector sidewall, wherein a portion of the dielectric region may separate the base region from the seed region, accord- ing to an embodiment.

In an embodiment, proximal portion of the seed region in contact with the semiconductor substrate may have a first length and a distal portion of the seed region directly over the proximal portion may have a second length, wherein a magnitude of a difference between the first length and the second length may be less than ten percent of the first length.

A sidewall of the seed region may be coupled to the base region in a base-seed coupling region, according to an embodiment.

In an embodiment, the seed region may be formed in a second semiconductor region wherein a second isolation region may be formed between the collector sidewall and the second semiconductor region.

A dielectric region may be formed adjacent the seed region, wherein the dielectric region may include a plurality of dielectric layers, according to an embodiment.

In an embodiment, a lateral link region may be formed between the extrinsic base region and the base region, wherein the lateral link region may include a base link portion that is coupled to a sidewall of the extrinsic base and to a portion of the base region.

An opening may be formed between the extrinsic base region and the seed region, according to an embodiment.

In another aspect, an embodiment may include a bipolar transistor device that includes a semiconductor substrate. A first isolation region may be formed within the semiconduc- tor substrate, according to an embodiment. In an embodi- ment, a collector region may be formed laterally adjacent the first isolation region within the semiconductor substrate in a first semiconductor region. The collector region may have an upper surface and a collector sidewall, according to an embodiment. In an embodiment, a base region may be disposed over the collector region. A dielectric region may be formed over at least a portion of the semiconductor substrate and over the collector sidewall, according to an embodiment. A seed region may be formed over the semi- conductor substrate within a seed opening in the dielectric region and coupled to the semiconductor substrate outside the base region, according to an embodiment. In an embodi- ment, an extrinsic base region may be formed over the seed region having a first portion formed between and laterally adjacent the seed region and the base region, wherein at least a portion of the extrinsic base is monocrystalline and wherein the monocrystalline portion of the extrinsic base may be electrically coupled to the base region. An emitter region may be formed over the base region, according to an embodiment.

A portion of the dielectric region may separate the base region from the seed region, according to an embodiment.

A sidewall of the seed region may be coupled to the base region, according to an embodiment.

In an embodiment, the seed region may be formed in a second semiconductor region, and wherein a second isolation region may be formed between the collector sidewall and the second semiconductor region.

A lateral link region may be formed between the extrinsic base region and the base region, wherein the lateral link region may include a base link portion that is coupled to a sidewall of the extrinsic base and to a portion of the base region.

In still another aspect, an embodiment may include a method of forming a bipolar transistor device. In an embodiment, the method may include forming a semiconductor substrate, forming an isolation region within the semiconductor substrate, and forming a collector region laterally adjacent the isolation region within the semiconductor substrate in a first semiconductor region, wherein the collector region includes an upper surface and a collector sidewall. An embodiment of the method may include forming a base region over the collector region and forming a dielectric region over at least a portion of the semiconductor substrate and over the collector sidewall. The method may include forming a seed region over the semiconductor substrate within a seed opening in the dielectric region and coupled to the semiconductor substrate outside the base region, according to an embodiment. In an embodiment, the method may include forming an extrinsic base region over the seed region having a first portion formed between and laterally adjacent the seed region and the base region, wherein at least a portion of the extrinsic base region may be monocrystalline and forming an emitter region over the base region.

Forming the seed region may include non-selective epitaxy, according to an embodiment of the method.

Forming the seed region may include selective epitaxy, according to an embodiment of the method.

DETAILED DESCRIPTION

FIG. 1 is a cross sectional side view of a conventional device 100. According to an embodiment, the conventional device 100 may include a semiconductor substrate 110, a collector region 120 formed within the semiconductor substrate 110, a base region 130 disposed over the collector region 120, an extrinsic base region 150 coupled to the base region 130, and an emitter region 160 formed over the base region 130. As with other figures presented herein, FIG. 1 depicts a symmetric half of the conventional device 100. The full conventional device 100 may be realized by mirroring the depicted elements of the conventional device 100 about a vertical axis of the emitter region 160.

Referring again to FIG. 1, and in an embodiment, the semiconductor substrate 110 may include a number of semiconductor regions. As used herein, the term, "semiconductor region" may refer to single or multiple semiconductor regions that may include regions formed by implantation (e.g., ion implantation) or layers grown by epitaxial growth. In an embodiment, the collector region 120 may be formed within the semiconductor substrate 110. A base region 130 may be formed over and in contact with the collector region 120. An extrinsic base region 150 is typically used to couple the base region 130 to a base electrode 159 through a base contact layer 158.

In the conventional device 100, the semiconductor substrate 110 typically includes include silicon (Si), carbon (C) and/or germanium (Ge). In the conventional device, the collector region 120 is formed in an upper portion of the semiconductor substrate 110. The base region 130 is typically formed over the collector region 120. The collector region 120, the base region 130, and the emitter region 150 may include one or more of Si, C and/or Ge. The conventional device 100 is typically configured as a npn transistor such that collector region 120 and the emitter region 150 include a n-type semiconductor and the base region 130 includes a p-type semiconductor. The collector region 120 is typically formed within the semiconductor substrate 110. The collector region includes a selectively implanted collector (SIC) region 124. A sub-collector region 126 is typically formed below the collector region 120 within the semiconductor substrate 110 and is used to provide an electrical path to a collector electrode 129 through a contact layer 128. In an embodiment, the sub-collector region 126 is typically doped at a higher level than the doping concentration of the collector region 120. A dielectric region 114 is typically formed in openings formed adjacent collector region 120 and is used to provide isolation between devices.

In the conventional device 100, the base region 130 is typically formed over the collector region 120 and may include first and second regions 132 and 134. The base region 130 is typically formed using Si or a mixed crystal alloy of Si and Ge, SiGe. In a conventional npn device, the base region 130 is formed using a p-type semiconductor. The base region 130 is typically doped with boron (B). In pnp conventional devices the base region 130 is formed using an n-type semiconductor. The extrinsic base region 150 may be formed over the semiconductor substrate 110 and dielectric region 114 and provides a low resistance connection to the base electrode 159. In a conventional device the extrinsic base region 150 is typically formed using polycrystalline material since it is formed in contact with dielectric region 114 and there is no single crystal or monocrystalline semiconductor material to form the extrinsic base using monocrystalline material. For example, the effective hole mobility of polycrystalline Si is limited to value of between about 5-20 cm$^2$/V-s, compared to monocrystalline Si which has a mobility between about 50-200 cm$^2$/V-s The extrinsic base poly is typically formed using silicon or silicon germanium. Because of this, the value of the base resistance, R$_b$. for the conventional device of FIG. 1 may be limited. The maximum frequency of oscillation, f$_{max}$, which is approximated by fmax~$[f_T/(8\pi R_b C_{be})]^{1/2}$ where R$_b$ is the base resistance, f$_T$ is the unity gain cutoff frequency, and C$_{be}$ is the base-collector capacitance may be limited by the value of R$_b$ in conventional device 100.

In the conventional device 100, the emitter region 160 may be formed over the base region 130. According to an embodiment, the emitter region 160 may include an intrinsic emitter region 162, a first emitter spacer layer 163, a second emitter spacer layer 164, and an emitter contact layer 168 formed over the intrinsic emitter region 162. The emitter region 160 may also include an emitter electrode 169 formed over the emitter contact layer 168, according to an embodiment.

Figure 2:
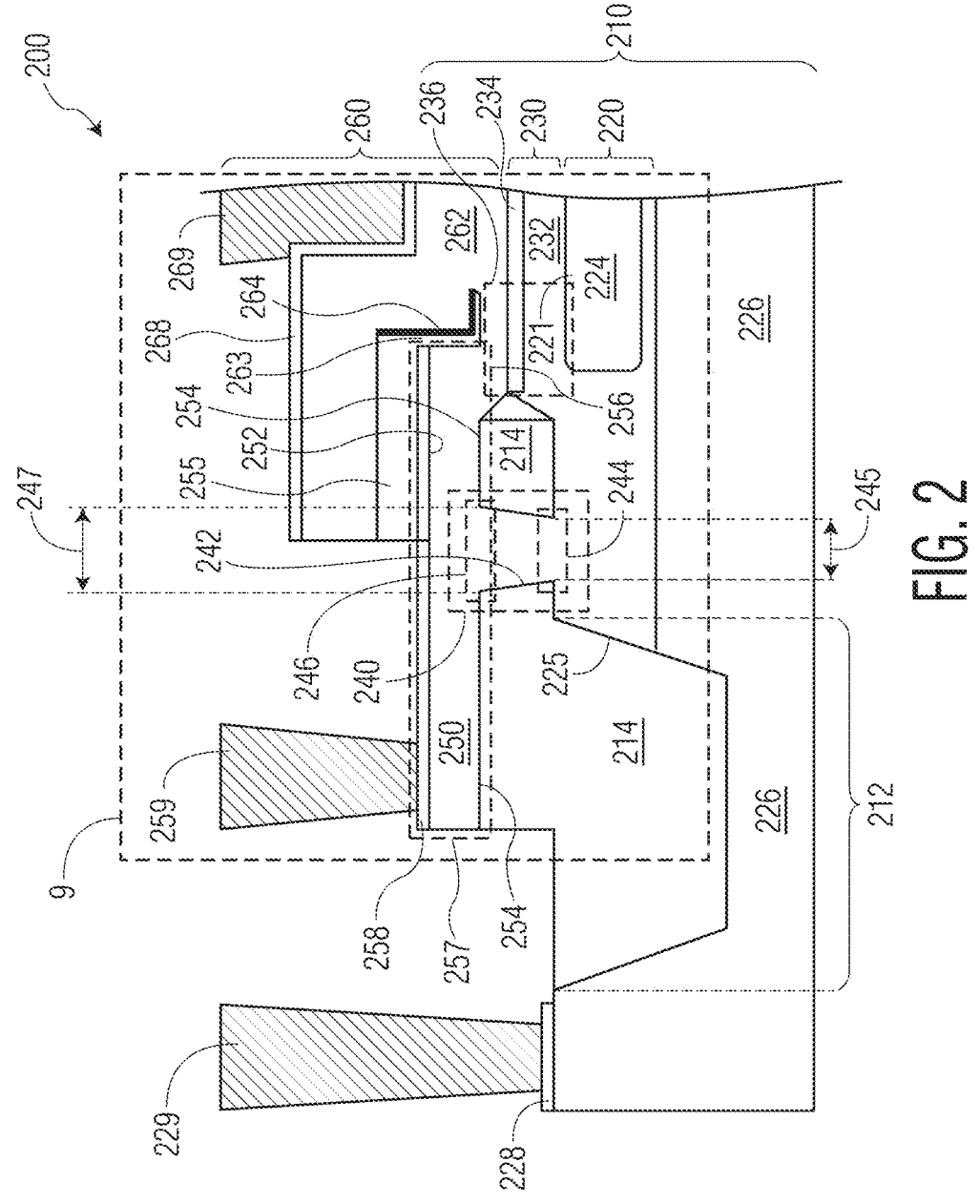
FIG. 2 is a cross sectional side view of a semiconductor device in accordance with an embodiment.

FIG. 2. is a cross sectional side view of an exemplary bipolar device 200, according to an embodiment. In an embodiment, the bipolar device 200 may include a semiconductor substrate 210, a first isolation region 212 formed within the semiconductor substrate 210 and a collector region 220 formed laterally adjacent the first isolation region 212. In an embodiment, a base region 230 may be disposed over the collector region 220. A dielectric region 214 may be formed over at least a portion of the semiconductor substrate 210 and over a collector sidewall 225 according to an embodiment. In an embodiment, a seed region 240 may be formed over the semiconductor substrate 210 within a seed opening 242 in the dielectric region 214 and coupled to the semiconductor substrate 210, outside the base region 230. An extrinsic base region 250 may be formed over the seed region 240 having a first portion formed between and laterally adjacent the seed region and the base region, wherein at least a portion of the extrinsic base 250 may be monocrystalline. The extrinsic base 250 may be electrically coupled to the base region 230, according to an embodiment. In an embodiment, an emitter region 260 may be formed over the base region.

Referring again to FIG. 2, and in an embodiment, the semiconductor substrate 210 may include one or more of silicon (Si), germanium (Ge), silicon germanium (SiGe), gallium arsenide (GaAs), gallium phosphide (GaP), indium gallium phosphide (InGaP), indium phosphide (InP), gallium nitride (GaN), aluminum nitride (AlN), indium nitride (InN), silicon carbide (SIC), sapphire, or other suitable materials. In other embodiments, the semiconductor substrate 210 may include Si on insulator (SOI). In an embodiment, the collector region 220 may be formed in an upper portion of the semiconductor substrate 210. The base region 230 may be formed over the collector region 220, according to an embodiment. In an embodiment, the collector region 220, the base region 230, and the emitter region 260 may include one or more of Si, Ge, SiGe and SiGe:C. In other embodiments, the collector region 220, the base region 230, and the emitter region 260 may include one or more of GaAs, GaN, AlN, InN, InGaP, and/or other suitable materials. In an embodiment, the semiconductor device 200 may be configured as a npn transistor such that the collector region 220 and the emitter region 260 include a n-type semiconductor and the base region 230 include a p-type semiconductor. In other embodiments, the semiconductor device 200 may be configured as a pnp transistor such that collector region 220 and the emitter region 260 include a p-type semiconductor and the base region 230 includes a n-type semiconductor. As used herein, the term "p-type semiconductor" refers to a semiconductor material with a hole concentration ranging from about 1e15 cm$^{-3}$ to about 1e20 cm$^{-3}$, though other higher or lower hole concentrations may be included. As used herein, the term "n-type semiconductor" refers to a semiconductor material with a net electron concentration ranging from about 1e15 cm$^{-3}$ to about 1e20 cm$^{-3}$, though other higher or lower electron concentrations may be used.

In an embodiment, the collector region 220 may be formed within the semiconductor substrate 210. According to an embodiment, the collector region 220 may include an upper surface 221, a collector sidewall 225. The dielectric region 214 (i.e., "isolation region") provides device to device isolation and separates the collector sidewall 225 from other regions of the device. A SIC region 224 may be formed in an upper portion of collector region, according to an embodiment. In some embodiments (e.g., npn transistor device), the collector region 220 may be formed using a n-type semiconductor. In other embodiments (pnp transistor device), the collector region 220 may be formed using a p-type semiconductor. In an embodiment, the collector region 220 may have a thickness of between about 400 angstroms and 4000 angstroms. In other embodiments, the collector region 220 may have a thickness between about 100 angstroms and about 10000 angstroms, though other thicknesses may be used. In an embodiment, the SIC region 224 may have a thickness of between about 200 angstroms and 2000 angstroms. In other embodiments, the SIC region 224 may have a thickness between about 50 angstroms and about 5000 angstroms, though other thicknesses may be used. In embodiments that include a n-type collector region (e.g., npn transistors), the collector region 220 may be doped with one or more of phosphorous (P), arsenic (As), antimony (Sb), lithium (Li) or other suitable dopants. In embodiments that include a p-type collector region 220 (e.g., pnp transistors), the collector region 220 may be doped with one or more of carbon (C), boron (B), oxygen (O), or indium (In) though other dopant species may be used. The doping concentration of the SIC region 224 may be in a range of 5e16 cm-3 to 5e18 cm$^{-3}$ though other higher or lower dopant concentrations may be used. According to an embodiment, a sub-collector region 226 may be formed below the collector region 220 within the semiconductor substrate 210 and provides a low resistance connection to the collector electrode 229 through a contact layer 228. In an embodiment, the sub-collector region 226 may have the same doping polarity as the SIC region 224 but may be doped at a higher doping concentration. In an embodiment, the doping concentration of the sub-collector region 226 may be in a range of about 5e18 cm$^{-3}$ to 1e21 cm$^{-3}$. In an embodiment, the sub-collector region 226 may be doped 10 to 100 times higher than the doping concentration of the collector region 220. According to an embodiment, the sub-collector region 226 may be doped 100 to 1000 times higher concentration than the collector region 220.

In an embodiment, the base region 230 may be formed over the collector region 220. The base region 230 may include a first base region 232 and a second base region 234 disposed over and coupled to the first base region 232. In an embodiment, the second base region 234 may be formed over the first base region 232. In an embodiment, the base region 230 may be formed under dielectric region 214 within a base cavity 236. In an embodiment, the base region 230 may be formed using a p-type semiconductor. In an embodiment, the base region 230 may be doped with carbon (C). In other embodiments, the base region 230 may be formed using a n-type semiconductor. In an embodiment, the base region 230 may be formed using Si$_{1-X}$Ge$_X$ where X is the Ge mole fraction. In an embodiment, one or more portions of the base region 230 may have a narrower bandgap than the intrinsic emitter 262. In an embodiment, the bandgap of the one or more portions of the base region 230 may be adjusted by changes in the Ge mole fraction. In an embodiment, the first base region 232 and the second base region 234 have the same bandgap (e.g., same Ge mole fraction, X). In an embodiment, the Ge mole fraction, X, may vary between about 0.05 and about 0.3 though other larger or smaller values of X may be used. In an embodiment, the value of the Ge mole fraction may be constant throughout the base region 230. In other embodiments, the first base region 232 may have a narrower bandgap than the second base region 234. In still other embodiments, the bandgap of the base region 230 may be continuously graded through both the first base region 232 and the second base region 234. In these embodiments, the grading of the base material, e.g., Si$_{1-X}$Ge$_X$ may include forming second base region 234 with a wider bandgap and continuously reducing to a narrower bandgap in the first base region 232. In an embodiment, the first base region 232 may have a thickness of between about 50 angstroms and 500 angstroms. In other embodiments, the first base region 232 may have a thickness between about 20 angstroms and about 2000 angstroms, though other thicknesses may be used. In an embodiment, the second base region 234 may have a thickness of between about 20 angstroms and 200 angstroms. In other embodiments, the second base region 234 may have a thickness between about 20 angstroms and about 2000 angstroms, though other thicknesses may be used. In an embodiment of a p-type base region, the first and second base regions 232 and 234 may be doped with one or more of C, B, O, or In though other dopant species may be used. In an embodiment of a n-type base region (e.g., a pnp transistor device), the first and second base regions 232 and 234 may be doped with one or more of P, Li, As, Sb though other dopant species may be used. In an embodiment, the doping concentration of the first base region 232 may be in a range of about 5e17 $cm^{-3}$ to 1e20 $cm^{-3}$. In other embodiments, the doping concentration of the first base region 232 may be in a range of about 1e17 $cm^{-3}$ to 1e20 $cm^{-3}$, though other higher or lower doping concentrations may be used.

In an embodiment, the seed region 240 may be formed over the semiconductor substrate 210. The seed region 240 may include a lower portion 244 (i.e., "proximal portion") coupled to the semiconductor substrate and an upper portion 246 (i.e., "distal portion") over the lower portion 244. The lower portion 244 may have a first length 245 (i.e., "proximal length"). The upper portion 246 may have a second length 247 (i.e., "distal length"). In an embodiment, the first length 245 may be smaller than the second length 247 (i.e., the first length 245 is less than ninety percent of the second length 247).

In an embodiment, the extrinsic base region 250 may be formed over the semiconductor substrate 210 and may include an upper surface 252, a lower surface 254 and may be coupled to the base region 230. In an embodiment, the extrinsic base region 250 may include monocrystalline silicon. In an embodiment, the extrinsic base region 250 may be formed from the seed region 240. In an embodiment, the lower surface 254 of the extrinsic base region 250 may be coupled to the seed region 240. In some embodiments, the extrinsic base region 250 may include silicon-germanium. In further embodiments, the extrinsic base region 250 may include alternating silicon and silicon germanium layers. The alternating silicon and germanium layers may form a superlattice structure. In embodiments that include a p-type base region 230 (e.g., a npn transistor device), the extrinsic base region may be doped with one or more of p type dopant(s) B, O, In or Al, though other dopant species may be used. In embodiments that include a n-type base region 230 (e.g., a pnp transistor device), the extrinsic base region 250 may be doped with one or more of n-type dopant(s) such P, Li, As, or Sb, though other dopant species may be used. In an embodiment, the extrinsic base region 250 may include the same dopant species as the base region 230. For example, the base region 230 and the extrinsic base region 250 may both include B doping. In an embodiment, a thickness of the extrinsic base region 250 may be between about 300 angstroms and 1500 angstroms although other thicknesses may be used. In an embodiment, the hole mobility of the extrinsic base region may between about 100 $cm^2/V$-s and about 200 $cm^2/V$-s while the associated sheet resistance, $R_{sh}$, of the extrinsic base region 250 may be between about 30 ohms per square and about 60 ohms per square. In other embodiments, the mobility of the extrinsic base region 250 may between about 50 $cm^2/V$-s and about 300 $cm^2/V$-s, while the associated $R_{sh}$ of the extrinsic base region may be between about 20 ohms per square and about 120 ohms per square.

In an embodiment, the extrinsic base region 250 may include a first portion 256 formed over the collector region 220 and the base region 230 and a second portion 257 formed in areas of the device adjacent the collector region 220 and the base region 230, over the dielectric layer 214. In an embodiment, a base electrode 259 may be coupled to the second portion 257 of the extrinsic base region 230 through a base contact layer 258.

In an embodiment, the emitter region 260 may be formed over the base region 230. According to an embodiment, the emitter region 260 may include an intrinsic emitter region 262, a first emitter spacer layer 263, a second emitter spacer layer 264, and an emitter contact layer 268 formed over the intrinsic emitter region 262. The emitter region 260 may also include an emitter electrode 269 formed over the emitter contact layer 268, according to an embodiment.

In an embodiment, the intrinsic emitter region 262 may be formed over the base region 230, the second emitter spacer layer 264, the first emitter spacer layer 263, and extrinsic base dielectric layer 255. In an embodiment, the intrinsic emitter region 262 may be formed using a n-type semiconductor. In other embodiments, the intrinsic emitter region 262 may be formed using a p-type semiconductor. In an embodiment, the intrinsic emitter region 262 may have a thickness of between about 100 angstroms and 1000 angstroms. In other embodiments, the intrinsic emitter region 262 may have a thickness of between about 50 angstroms and about 5000 angstroms, though other thicknesses may be used. In an embodiment that includes a p-type emitter region 260 (e.g., a pnp transistor device), the intrinsic emitter region 262 may be doped with one or more of B, O, Al, or In though other dopant species may be used. In an embodiment of an n-type emitter region (e.g., a npn transistor device), the first and second base regions 232 and 234 may be doped with one or more of P, Li, As, or Sb though other dopant species may be used. In an embodiment, the doping concentration of the intrinsic emitter region 262 may be in a range of about 5e17 cm-3 to 5e21 $cm^{-3}$.

According to an embodiment, the emitter contact layer 268 may be formed over the intrinsic emitter region 262. In an embodiment, the emitter contact layer 268 may be formed using titanium-tungsten (TiW), titanium tungsten nitride (TiWN), tungsten silicide (WSi), cobalt silicide (CoSi), platinum silicide (PtSi), nickel platinum silicide (NiPtSi), or other suitable material(s). The emitter electrode 269 may be formed over the emitter contact layer 268, according to an embodiment. In an embodiment, the emitter electrode 269 may be formed from one of copper, aluminum, tungsten, or other suitable conducting materials.

FIGS. 3-8 depict further embodiments of bipolar transistor devices with seed regions in semiconductor devices 300, 400, 500, 600, 700, and 800 respectively. In these embodiments, the configuration and location of the seed region (e.g., seed regions 340, 440, 540, 640, 740, 840) may be adjusted to optimize the performance of the transistors for various applications. This may be accomplished, in part, by the embodiments of FIGS. 2, 3A, 3B, 4, 5, 6, 7, and 8 respectively. The numbered drawings in FIGS. 3A, 3B, 4, 5, 6, 7, and 8 have like numbering and may be compared to the description and reference numbers associated with FIG. 2. For example, the semiconductor substrate 210 in FIG. 2 correspond to the semiconductor substrates 310, 410, 510, 610, 710, and 810 in FIGS. 3-8. Also, for the sake of brevity, descriptions of numbered references and fabrication details associated with each numbered item may not be repeated where adequate descriptions were given in connection with the descriptions of FIG. 2.

Figure 3A:
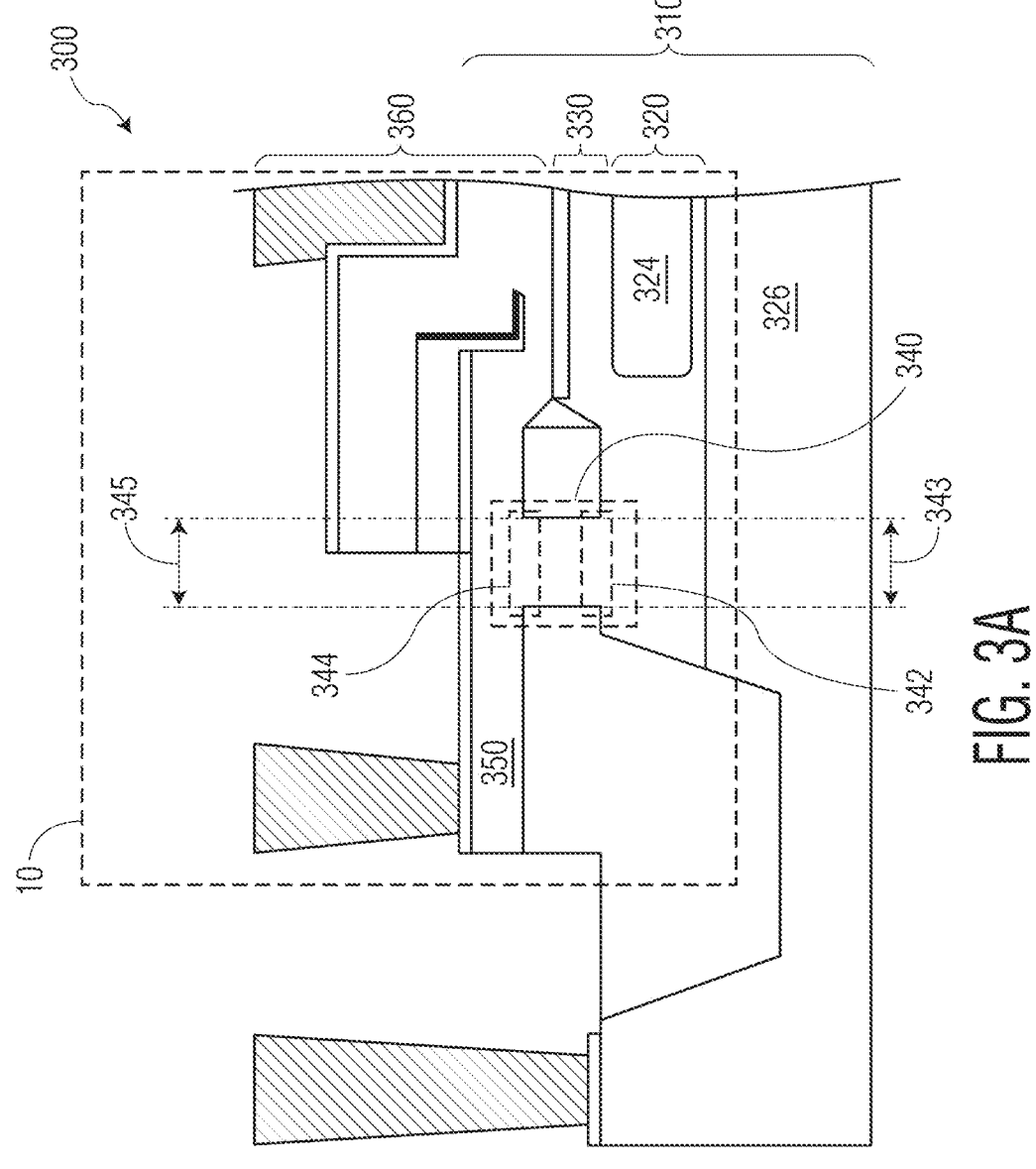
FIGS. 3A and 3B are cross sectional side views of a semiconductor device in accordance with an embodiment.
Figure 3B:
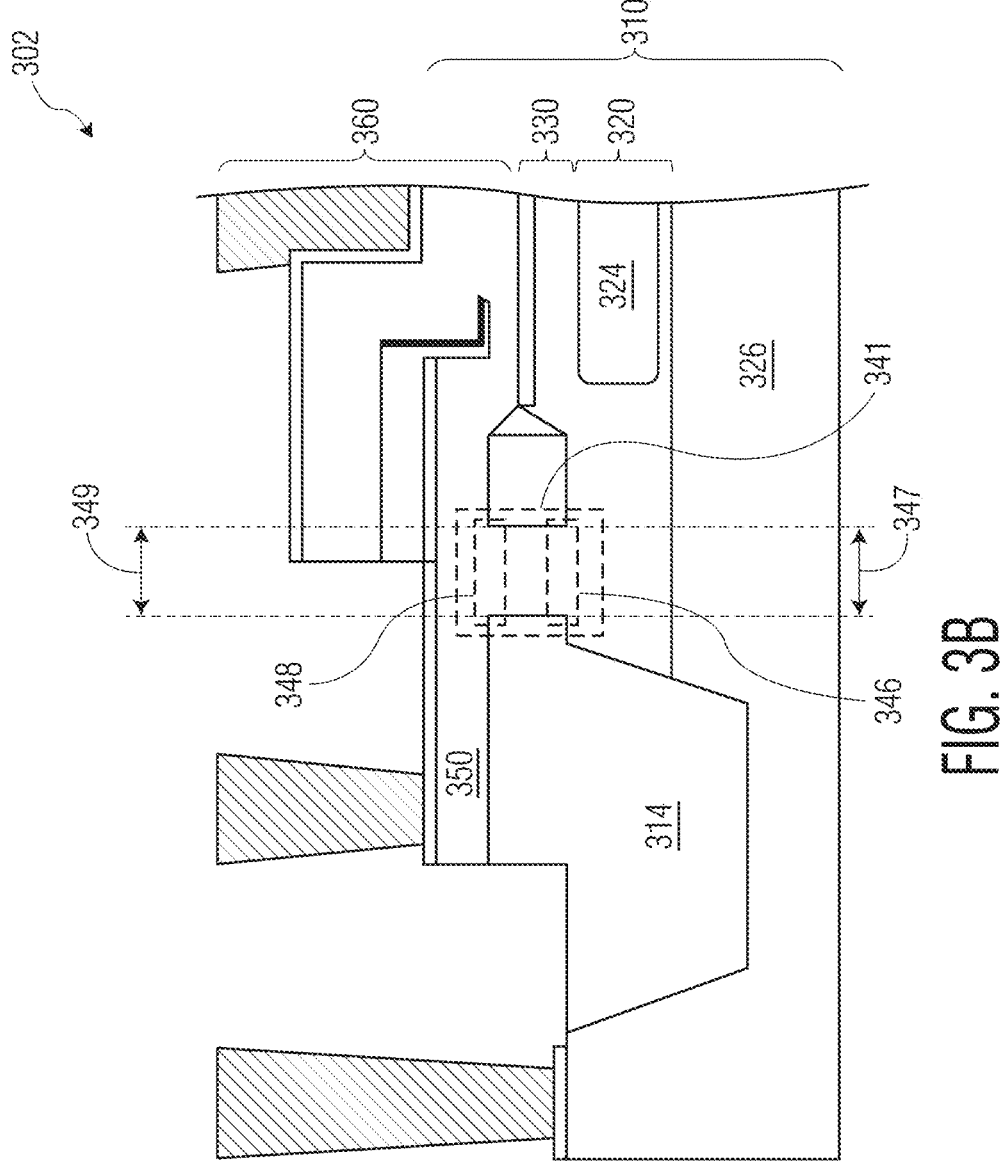

FIGS. 3A and 3B are a cross sectional side views of an exemplary semiconductor device 300, according to an embodiment. The semiconductor device 300 may include a semiconductor substrate 310 that includes semiconductor regions to define a collector region 320, a base region 330, a seed region 340, an extrinsic base region 350, and an emitter region 360, as described above. A number of other components of the semiconductor device 300 may be configured in a manner similar to the transistor device 200 of FIG. 2. For example, the semiconductor substrate 310 and its associated semiconductor regions (e.g., collector region 320, base region 330, etc.) may be formed in a similar manner as the semiconductor substrate 210.

Referring again to FIG. 3A, and in an embodiment, a lower portion 342 (i.e., "proximal portion") of the seed region 340 in contact with the semiconductor substrate has a first length 343 and an upper portion 344 (i.e., "distal portion") of the seed region 340 directly over the first portion has a second length 345. The first length 343 and the second length 345 may have approximately the same length (i.e., a magnitude of a difference between the first length 343 and the second length 345 is less than ten percent of the first length 343), according to an embodiment.

Referring again to FIG. 3B, and in an embodiment, a lower portion 346 of a faceted seed region (i.e., "seed region") 341 in contact with the semiconductor substrate has a first length 347 and an upper portion 348 of the faceted seed region 341 directly over the lower portion has a second length 349. The first length 347 may be greater than the second length 349 (i.e., the first length 347 is more than ten percent larger than the second length 349), according to an embodiment.

Figure 4:
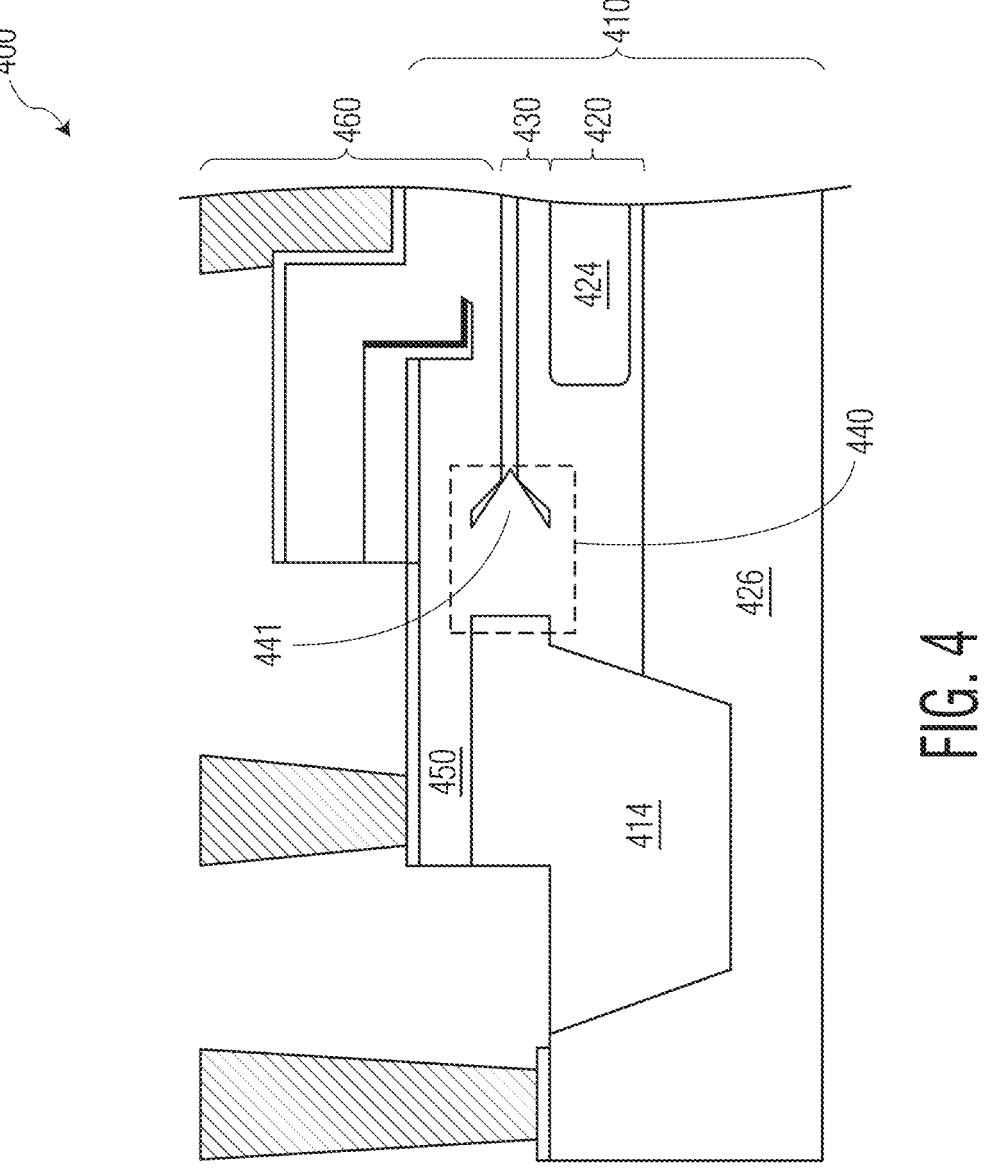
FIG. 4 is a cross sectional side view of a semiconductor device in accordance with an embodiment.

FIG. 4 is a cross sectional side view of an exemplary semiconductor device 400, according to an embodiment. The semiconductor device 400 may include a semiconductor substrate 410, dielectric region 414, and may be configured with semiconductor regions to define a collector region 420, a base region 430, a seed region 440, an extrinsic base region 450, and an emitter region 460, as described above. In an embodiment, SIC region 424 may be formed within collector region 420 and over sub-collector 426. In an embodiment, the seed region 440 may be coupled to the base region. This may be accomplished by positioning the seed region 440 and the base region 430 in close proximity to each other such that no dielectric material that would be analogous to the base dielectric region 214 of FIG. 2 exists between the seed region 440 and the base region 430. In this embodiment, the semiconductor material used to from the base region 430 may be formed directly adjacent a sidewall of the seed region 440 and may form a base-seed coupling region 441. In an embodiment, at least a portion the base-seed coupling region 441 may be monocrystalline.

Figure 5:
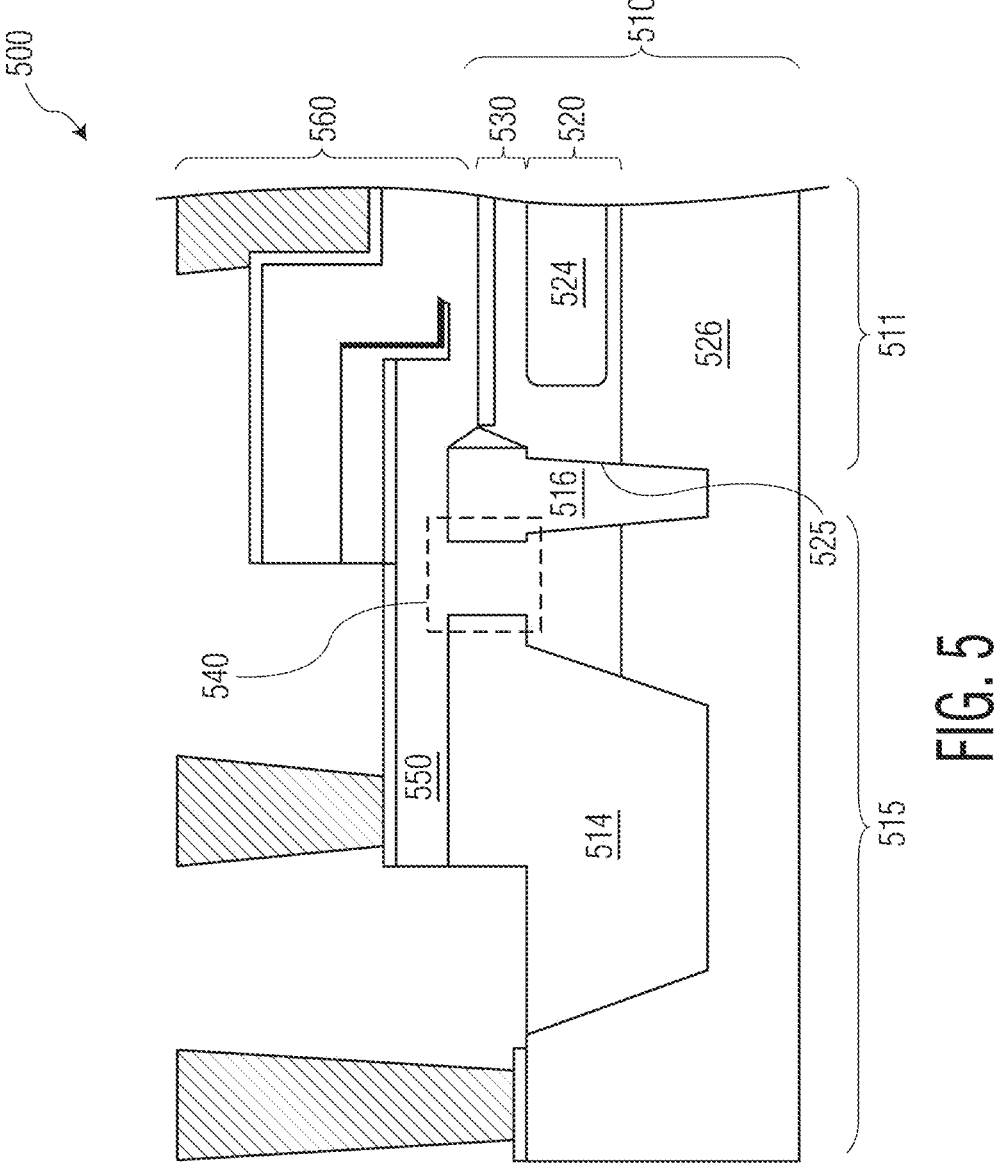
FIG. 5 is a cross sectional side view of a semiconductor device in accordance with an embodiment.

FIG. 5 is a cross sectional side view of an exemplary semiconductor device 500, according to an embodiment. The semiconductor device 500 may include a semiconductor substrate 510 with semiconductor regions and a dielectric region 514 (i.e., "first isolation region"), to define a collector region 520, a base region 530, a seed region 540, an extrinsic base region 550, and an emitter region 560, as described above. The collector region 520, a base region 530, a seed region 540, and emitter region 560 may be formed in a first semiconductor region 511, according to an embodiment, according to an embodiment. In an embodiment, selectively implanted collector region 524 may be formed within collector region 520 and over sub-collector 526. In an embodiment, the first isolation region 514 and the seed region 540 may be formed in a second semiconductor region 515, and wherein a second isolation region 516 may be formed between a collector sidewall 525 and the semiconductor region 515.

Figure 6:
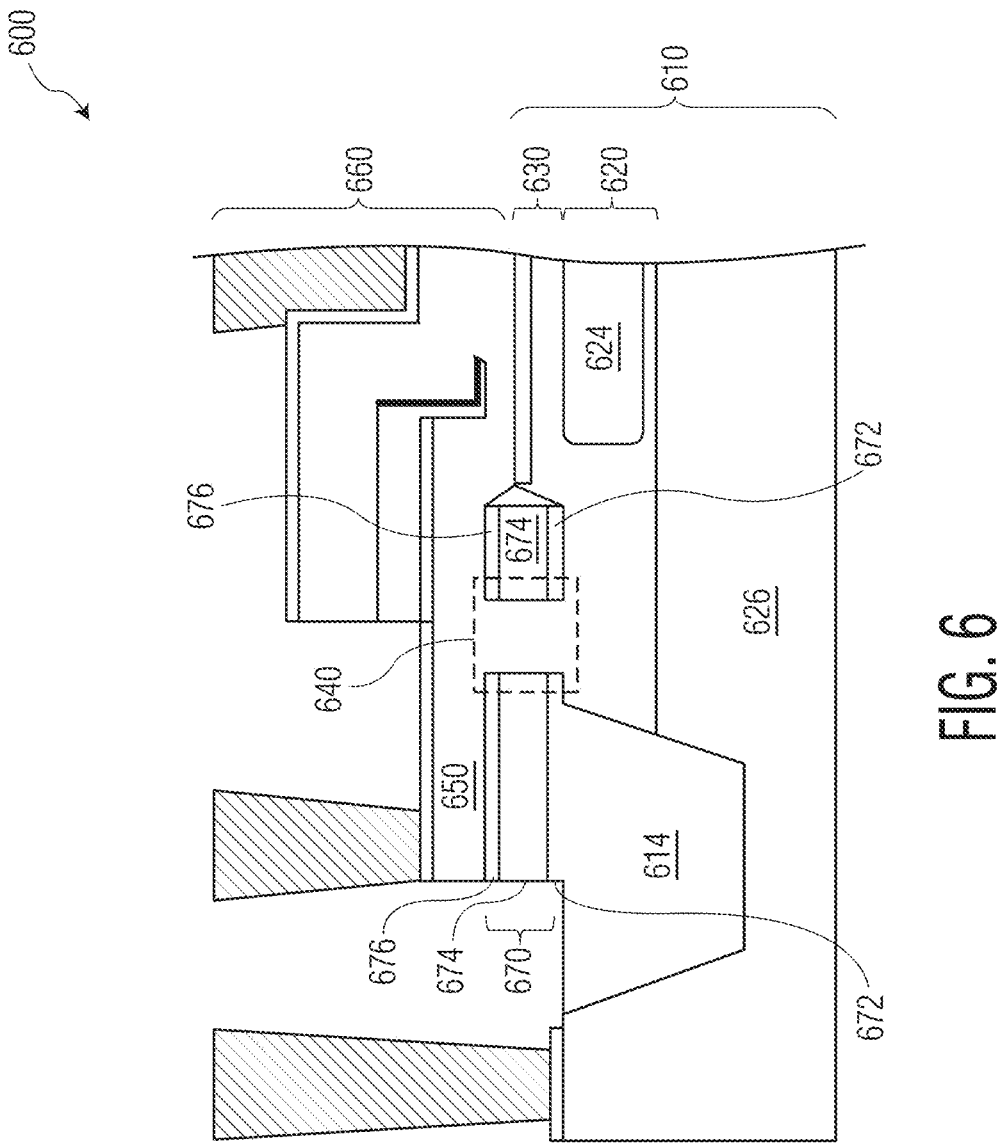
FIG. 6 is a cross sectional side view of a semiconductor device in accordance with an embodiment.

FIG. 6 is a cross sectional side view of an exemplary semiconductor device 600, according to an embodiment. The semiconductor device 600 may include a semiconductor substrate 610 semiconductor regions and a dielectric region 614, a collector region 620, a base region 630, a seed region 640, an extrinsic base region 650, and an emitter region 660, as described above, according to an embodiment. In an embodiment, selectively implanted collector region 624 may be formed within collector region 620 and over sub-collector 626. In an embodiment, a dielectric region 670 formed laterally adjacent the seed region may include a plurality of dielectric layers. In an embodiment, the dielectric region 670 may include a first dielectric layer 672 and a second dielectric layer 674 formed over the first dielectric layer 672. A third dielectric layer 676 may be formed over the second dielectric layer 674. It should be appreciated that in other embodiments (not shown), the dielectric region 670 may include additional dielectric layers. In an embodiment, the first dielectric layer 672 may have a thickness between about 20 angstroms and about 200 angstroms. In other embodiments, the first dielectric layer 672 may have a thickness between about 10 angstroms and 1000 angstroms. In an embodiment, the second dielectric layer 674 may have a thickness between about 20 angstroms and about 200 angstroms. In other embodiments, the second dielectric layer 674 may have a thickness between about 10 angstroms and 1000 angstroms. In an embodiment, the third dielectric layer 676 may have a thickness between about 20 angstroms and about 200 angstroms. In other embodiments, the first dielectric layer 672 may have a thickness between about 10 angstroms and 1000 angstroms. In an embodiment, each of the first dielectric layer 672, the second dielectric layer 674, the third dielectric layer 676 may be formed from materials described in connection with materials used to form the first dielectric layer 263 and second dielectric layer 264 of FIG. 2. In an embodiment, the first dielectric layer 672 and the third dielectric layer 676 may include a dielectric material of one type (e.g., TEOS) while the second dielectric layer 674 may include dielectric materials of a second type (e.g., SiN). In other embodiments, the types of dielectric materials used to form the first, second, and third dielectric layers may be of the same type or different types with no restrictions on how many types of dielectric materials are used (e.g., each of the first, second, and third dielectric layers may be of a different type).

Figure 7A:
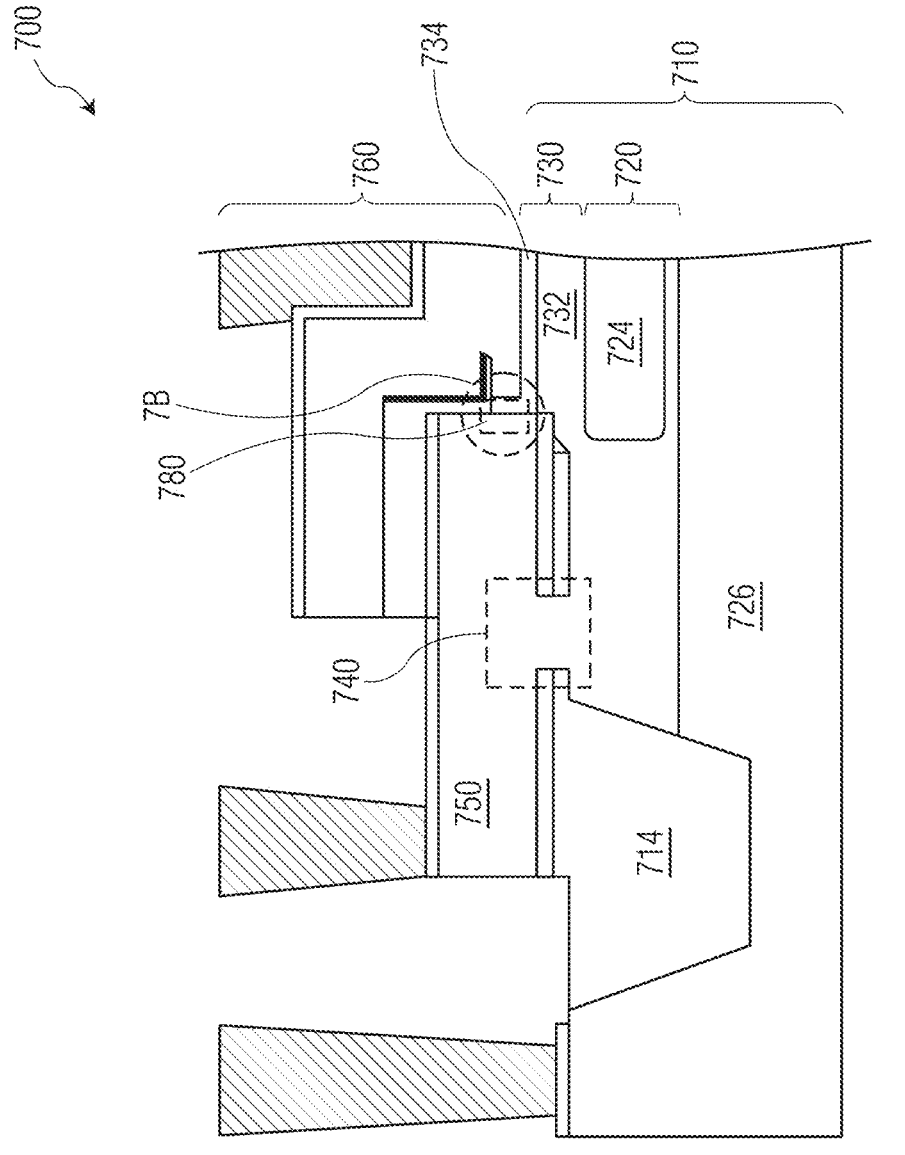
FIGS. 7A and 7B are cross sectional side views of a semiconductor device in accordance with an embodiment.
Figure 7B:
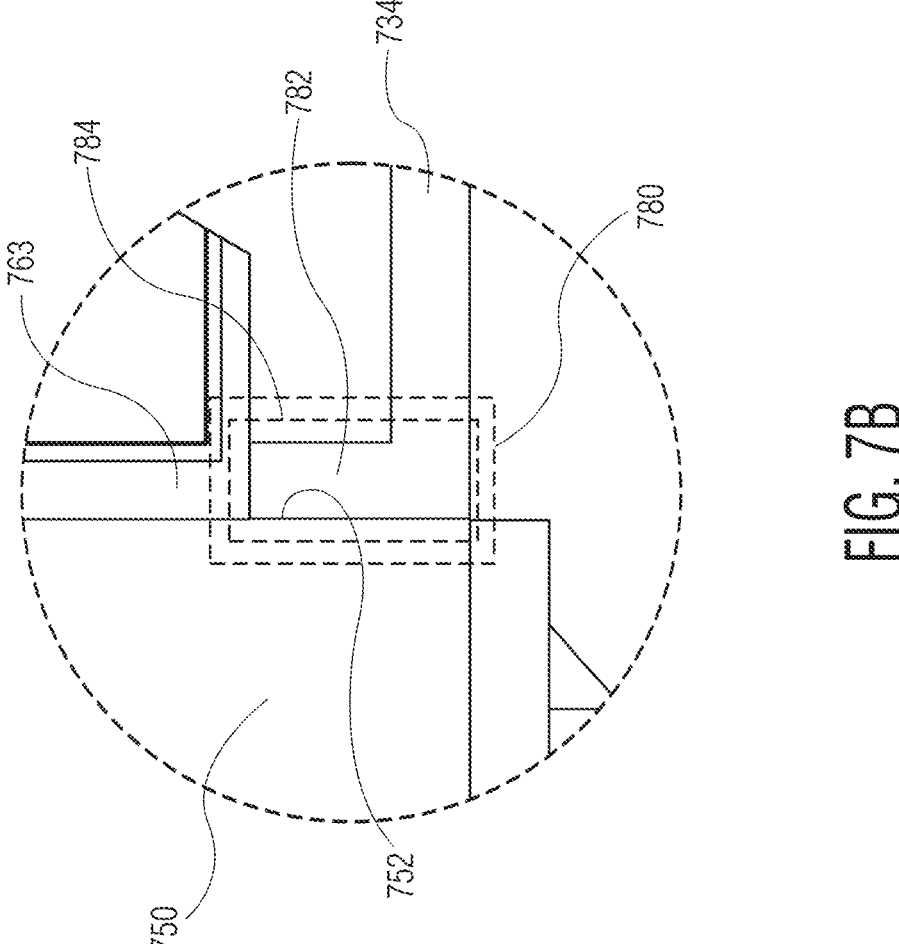

FIG. 7A is cross sectional side view of an exemplary semiconductor device 700 and FIG. 7B is a cross sectional side view of region 7B, according to an embodiment. The semiconductor device 700 may include a semiconductor substrate 710 and semiconductor regions to define a dielectric region 714, a collector region 720, a base region 730, a seed region 740, an extrinsic base region 750, an emitter region 760, as described above. In an embodiment, base region 730 may include first and second base regions 732, 734. Selectively implanted collector region 724 may be formed within collector region 720 and over sub-collector 726, according to an embodiment. In an embodiment, a lateral link region 780 may electrically couple the base region 730 to the extrinsic base region 750.

Referring again go FIGS. 7A and 7B, in an embodiment, the lateral link region 780 may be formed between the extrinsic base region 750 and the base region 730. The lateral link region 780 may include a base link portion 782 that is coupled to an extrinsic base sidewall 752 and to a portion of the second base region 734 and may be formed within a lateral link opening 784. The lateral link opening 784 may be formed under a portion of emitter spacer dielectric layer 763. In an embodiment, the base link portion may include a single crystal semiconductor material (e.g., Si or SiGe). At least a portion of the extrinsic base region 750 that is coupled to the base link portion 782 may include a monocrystalline region, according to an embodiment. Likewise, in an embodiment, a portion of the base link portion 782 may include a monocrystalline region.

Figure 8:
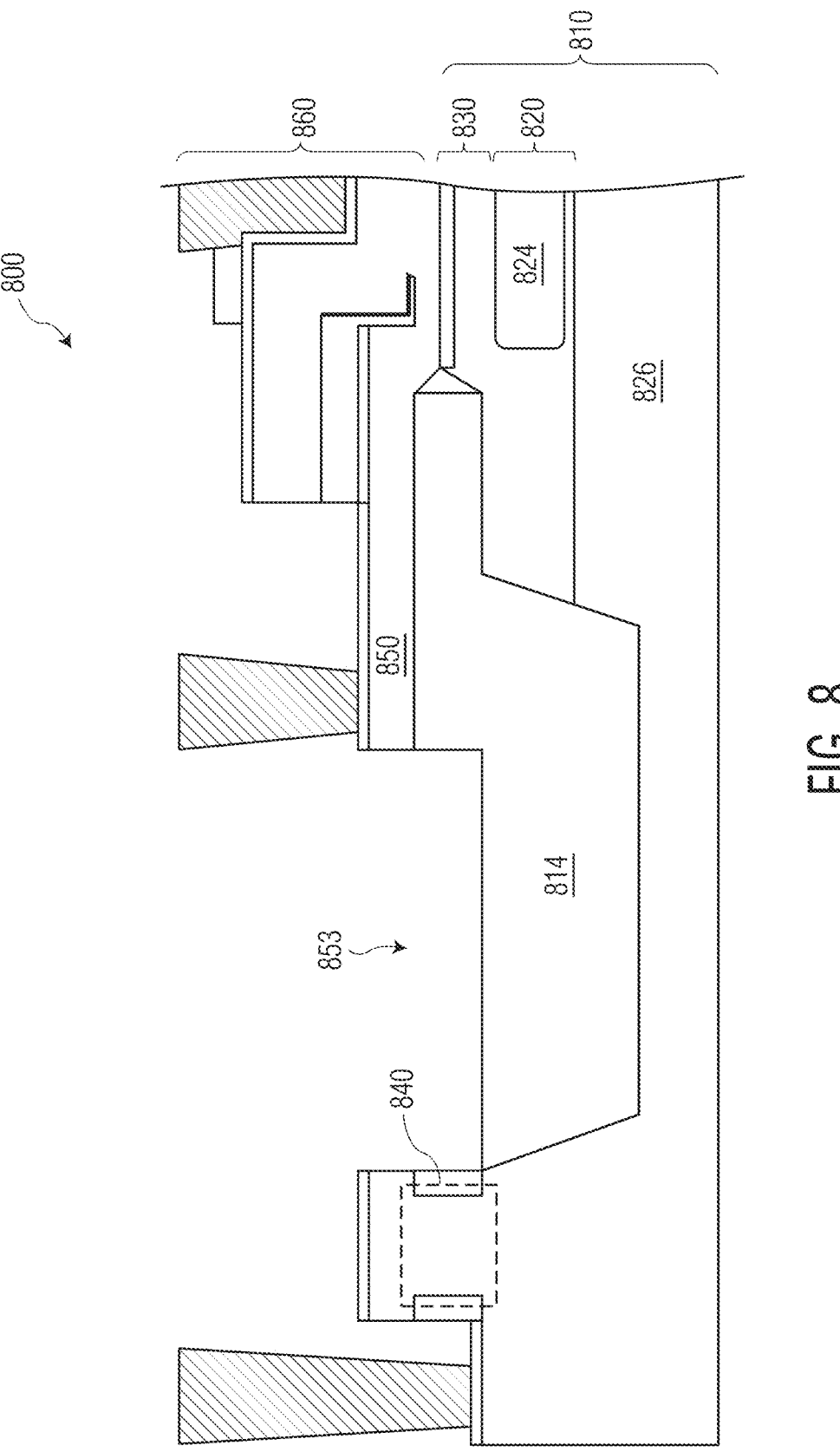
FIG. 8 is a cross sectional side view of a semiconductor device in accordance with an embodiment.

FIG. 8 is cross sectional side view of an exemplary semiconductor device, according to an embodiment. The semiconductor device 800 may include a semiconductor substrate 810 and semiconductor regions to define a dielectric region 814, a collector region 820, a base region 830, a seed region 840, an extrinsic base region 850, and an emitter region 860, as described above. In an embodiment, selectively implanted collector region 824 may be formed within collector region 820 and over sub-collector 826. In an embodiment, the extrinsic base region 850 may be separated from the seed region 840 by an extrinsic base opening 853. In an embodiment, at least a portion of the extrinsic base region 850 may include a monocrystalline region.

FIGS. 9A, 9B, 9C, 10A, and 10B depict process flow diagrams alongside corresponding cross-sectional views depicting a series of fabrication steps for producing the bipolar transistor devices 200, 300, 302, 400, 500, 600, 700, and 800 of FIGS. 2, 3A, 3B, 4, 5, 6, 7A, 7B, and 8, in accordance with an example embodiment. In an embodiment, the method includes a sequence of steps, for which only the salient are shown for convenience in illustration. For example, the method may include a number of acts directed to preparing the semiconductor substrate for the fabrication method that are not described in detail herein. The ordering of the acts may vary in other embodiments.

Figure 9A:
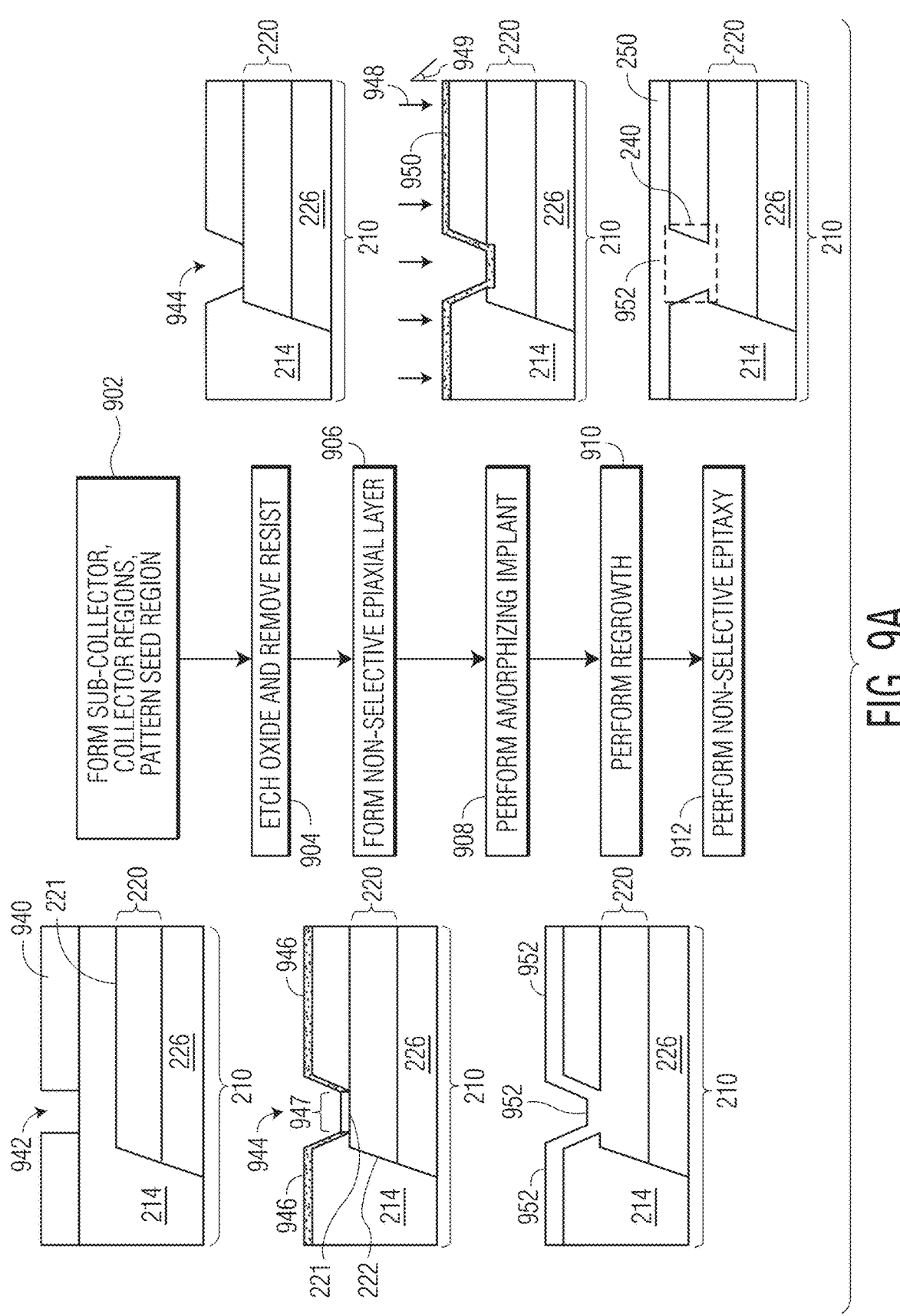
Figure 9B:
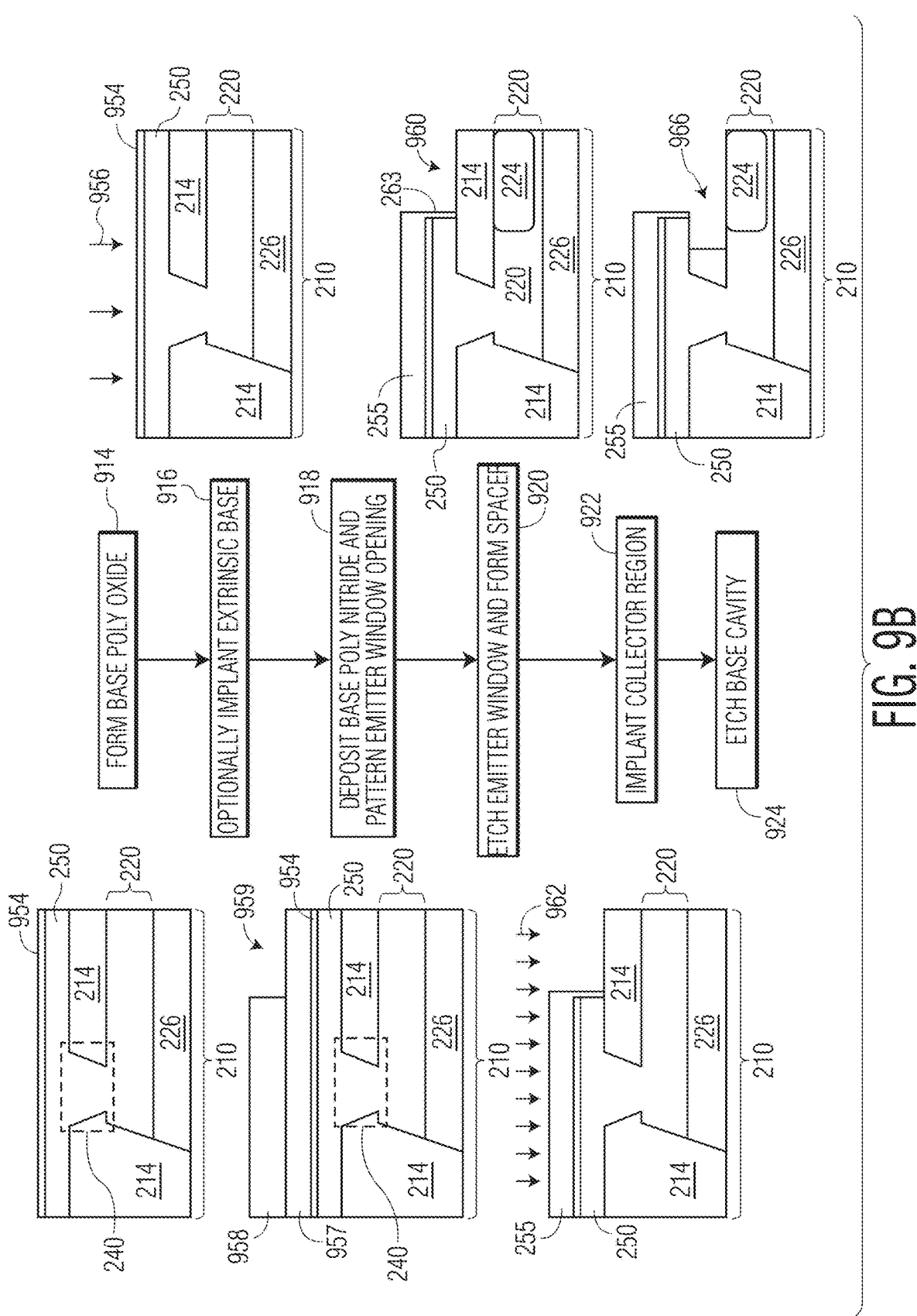

FIGS. 9A 9B, and 9C are process flow diagrams with corresponding cross sectional side views, detailing partial formation of an area 9 of FIG. 2, and describing a method for fabricating the bipolar transistors device 200 of FIG. 2 in accordance with an embodiment. In this description, a partial fabrication sequence of the device 200 of FIG. 2 is given, with reference to optional steps that may be undertaken to arrive at other embodiments in FIGS. 4, 5, 6, 7, and 8.

Referring to FIG. 9A, in block 902, the method may include forming a collector region 220 within a semiconductor substrate 210, forming a sub-collector region 226, forming a dielectric region 214 adjacent the collector region 220, and patterning the seed region 240 over the substrate 210, according to an embodiment. In an embodiment, the forming the sub-collector region 226 may include implanting a dopant species (e.g., phosphorus) using ion implantation (not shown). Forming the collector region 220 may include using dry or wet etching to form a collector mesa 222. In an embodiment, a dielectric material (e.g., $SiO_2$ or TEOS) may be deposited around the collector mesa 222 and over the upper surface 221 of the collector to form a dielectric region 214 for, e.g., shallow trench isolation (STI) to provide isolation between adjacent devices. In an embodiment, the dielectric region 214 may be formed using plasma enhanced chemical vapor phase deposition (PECVD), low pressure chemical vapor phase deposition (LPCVD), chemical vapor phase deposition (CVD), thermal growth techniques, or other suitable deposition techniques. In the embodiment of bipolar device 600 of FIG. 6, dielectric region 614 may be followed by the deposition of first, second, and third dielectric layers 672, 674, 676 (not shown). In an embodiment, the first, second, and third dielectric layers 672, 674, 676 may be formed using plasma enhanced chemical vapor phase deposition (PECVD), low pressure chemical vapor phase deposition (LPCVD), chemical vapor phase deposition (CVD), thermal growth techniques, or other suitable deposition techniques (not shown). Patterning the dielectric region 214 (or in the embodiment of FIG. 6, first, second, and third dielectric layers 672, 674, 676) may include forming a resist layer 940 over the substrate 210 and using photolithography or other suitable technique to form an opening 942 in the resist layer 940. In the embodiment of FIG. 6, one with skill in the art will understand that other patterning etching of first, second, and third dielectric layers 672, 674, 676 replaces etching of layer 214, as is described above (not shown).

Referring to FIG. 9A, in block 904, the method may include etching an opening 944 in dielectric region 214. According to an embodiment of the method, the dielectric region 214 may be etched to form opening 944 using one or more wet and/or dry etches. In an embodiment, the wet etches may be accomplished using buffered oxide etch (a mixture of ammonium fluoride and hydrofluoric acid), hydrofluoric acid, or other suitable wet chemistries. The dry etches may be accomplished using sulfur hexafluoride, carbon tetrachloride, boron trichloride gases in a plasma etching system. Plasma etching may be accomplished using reactive ion etching (RIE), inductively coupled plasma (ICP) etching, or other suitable etch techniques. In an embodiment, wet etching may be used to remove oxide-based films (e.g., TEOS and other oxides) while nitride-based films (e.g., SiN and other nitrides) may be etched with F-based dry etching. After etching, the resist layer 940 may be stripped off the dielectric region 214 using a suitable resist strip methods, well known to those with skill in the art (not shown).

Referring to FIG. 9A, in block 906, an embodiment of the method may include forming a non-selective epitaxial layer 946 over dielectric region 214 and within the opening 944 to partially form the seed region 240. According to an embodiment of the method, a region 947 of the non-selective epitaxial layer 946 may include single crystal (e.g., Si) formed within the opening 944 where it contacts the upper surface 221 of the collector region 220. On the other hand, the portions of non-selective epitaxial layer 946 outside the region 947 may be polycrystalline (e.g., poly Si). In an embodiment, the thickness of non-selective epitaxial layer 946 may be between about 100 and about 300 angstroms. In other embodiments, the thickness of non-selective epitaxial layer 946 may be between about 50 and about 1000 angstroms, though other smaller or larger thicknesses may be used for non-selective epitaxial layer 946. In an embodiment, one or more of chemical vapor phase deposition (CVD), metal-organic vapor phase deposition (MOCVD), molecular beam epitaxy (MBE) or other suitable techniques may be used to form non-selective epitaxial layer 946.

Referring to FIG. 9A, in block 908, an embodiment of the method may include performing an amorphizing implant 948 of the non-selective epitaxial layer 946. In an embodiment, performing the amorphizing implant 948 may include implanting Ge or other suitable species such as argon (Ar), xenon (Xe), Si, etc. into the non-selective epitaxial layer 946. The amorphizing implant may include a dose of between about $1e14$ $cm^{-2}$ and $1e16$ $cm^{-2}$ at an energy of between about 10 keV and about 30 keV, according to an embodiment. In an embodiment, the amorphizing implant 948 may impinge the non-selective epitaxial layer 946 at an angle 949 that is zero degrees (i.e., the amorphizing implant 949 is at normal (i.e., 90 degrees) incidence with respect to the non-selective epitaxial layer 946). In other embodiments, the amorphizing implant 948 may impinge the non-selective epitaxial layer 946 at an angle 949 that is between about 0 and about 45 degrees, depending on the slope of sidewalls of opening 944. In an embodiment, the non-selective epitaxial layer 946 may be converted to amorphous layer 950.

Referring to FIG. 9A, block 910, an embodiment of the method may include using solid-phase regrowth to convert the amorphous layer 950 to a single crystal layer 952. In an embodiment, the solid phase regrowth may include heating the amorphous layer 950 to a temperature of between 500 degrees Celsius and 700 degrees Celsius with an ambient condition that includes a pressure between about 1 m Torr and 800 Torr. The time needed to convert the amorphous layer 950 to single crystal layer 952 may be between about 1 minute and 20 hours, depending on the temperature used, according to an embodiment. In other embodiments, a laser melt process may be used to accomplish the solid-phase regrowth wherein laser energy is scanned over the wafer and heats the amorphous layer 950 to convert it to single crystal layer 952.

Referring to FIG. 9A, block 912, an embodiment of the method may include performing non-selective epitaxy using the single crystal layer 952 as a seed layer to completely form the seed region 240 and the extrinsic base region 250. The techniques for non-selective epitaxial growth the extrinsic base region 250 and seed region 240 may be analogous to those described in connection with the formation of non-selective epitaxial layer described in connection with block 906. In an embodiment at least a portion of the extrinsic base region 250 may be monocrystalline (e.g., single crystal Si).

Referring to FIG. 9B, block 914, an embodiment of the method may include forming a first dielectric layer 954 over the seed region 240 and the extrinsic base region 250. In an embodiment, the first dielectric layer 954 (e.g., poly oxide) may be grown over the seed region 240 using thermal growth, PECVD, LPCVD, PVD, or a combination of these or other techniques. In an embodiment, the first dielectric layer 954 may between about 50 angstroms thick and about 200 angstroms thick, though other thicknesses may be used.

Referring to FIG. 9B, block 916, an embodiment of the method may optionally include implanting the extrinsic base region 250. In an embodiment, an implant species 956 (e.g., boron for a npn transistor or phosphorous for a pnp transistor) may be implanted into the extrinsic base region 250 through the first dielectric layer 954. For example, in a npn transistor, a boron implant with a dose of between about $0.5e16$ cm$^{-2}$ and about $2e16$ cm$^{-2}$ may be used in conjunction with an accelerating energy of about 15 keV to implant the implant species 956 into extrinsic base region 250. In an embodiment, the implant species 956 may be used to dope the extrinsic base region 250 to reduce the overall base resistance. In an embodiment, the implant may be activated by annealing the processed semiconductor substrate 210 at a temperature between about 900 degrees Celsius and 1070 degrees Celsius.

Referring to FIG. 9B, block 918, an embodiment of the method may include depositing a second dielectric layer 957 over the first dielectric layer 954, dispensing resist layer 958 over second dielectric layer 957, and patterning an opening 959 in resist layer 958. In an embodiment, second dielectric layer 957 (e.g., silicon nitride or other suitable dielectric layer) may be formed using LPCVD, PECVD, or other suitable techniques. For the bipolar device 800 of FIG. 8, an additional opening in resist layer 958 may be formed to etch opening 853 at the same time as forming opening 959 (not shown).

Referring to FIG. 9B, block 920, an embodiment of the method may include etching emitter opening 960 to form extrinsic base dielectric layer 255 and forming first emitter spacer 263 over the extrinsic dielectric layer 255. Etching base second dielectric layer 957 and base first dielectric layer 954 to form emitter opening 960 may include using opening 959 formed in resist layer 958 (not shown), according to an embodiment. According to an embodiment of the method, the first and second base dielectric layers 954 and 957 in the emitter opening 960 may be etched using one or more wet and dry etches (not shown). For the bipolar device 800 of FIG. 8, opening 853 may be etched at the same time as emitter opening 960 (not shown). In an embodiment, the wet etches may be accomplished using buffered oxide etch (a mixture of ammonium fluoride and hydrofluoric acid), hydrofluoric acid, or other suitable wet chemistries. The dry etches may be accomplished using sulfur hexafluoride, carbon tetrachloride, boron trichloride gases in a plasma etching system. Plasma etching may be accomplished using reactive ion etching (RIE), inductively coupled plasma (ICP) etching, or other suitable etch techniques. In an embodiment, wet etching may be used to remove oxide-based films (e.g., TEOS and other oxides) while nitride-based films (e.g., SiN and other nitrides) may be etched with F-based dry etching. In an embodiment, the extrinsic base region 250 may be etched using dry or wet chemistries (e.g., hydrobromic acid (HBr) and chlorine (CI)-based etching). In an embodiment, the emitter window etch may stop on the dielectric region 214 over the collector region 220. In an embodiment, the first inside spacer layer 263 may be formed using the dielectric deposition methods described above (e.g., PECVD, LPCVD, thermal deposition).

Referring to FIG. 9B, block 922, an embodiment of the method may include implanting collector region 220 to form SIC region 224, according to an embodiment. According to an embodiment, implanting the collector region 220 may include ion implantation to incorporate a dopant species into the collector region 220. A SIC implant may be used to form SIC region 224 In an embodiment, a dopant species 962 (e.g., phosphorous or arsenic) may be implanted to form the SIC region 224. In other embodiments (not shown), the SIC region 224 may be replaced with an epitaxially grown region, formed using epitaxial growth such as metal organic chemical vapor phase epitaxy (MOCVD), chemical vapor phase epitaxy (CVD), molecular beam epitaxy (MBE), or other suitable methods.

Referring to FIG. 9B, block 924, an embodiment of the method may include etching base cavity 966, according to an embodiment. In an embodiment, forming base cavity includes etching dielectric region 214, according to an embodiment. The base cavity 966 may be formed by wet etching the dielectric region 214 using isotropic wet and/or dry etching performed using one of the techniques described above. In an embodiment, the base cavity etch may expose an upper surface of the collector region 220 and selectively implanted collector 224. In the embodiment of device 400 of FIG. 4, the base cavity etch may expose the sidewall of the seed region 240 (not shown).

Referring to FIG. 9C, block 926, an embodiment of the method may optionally include forming lateral link opening 784 to arrive at the embodiment of bipolar device 700 of FIGS. 7A and 7B. Forming lateral link opening 784 may include forming an extrinsic base opening 927 in a portion of the emitter spacer dielectric 763 that will laterally couple the second base region 734 to the extrinsic base region 750 to form lateral link region 780 (not shown here), according to an embodiment.

Referring to FIG. 9C, block 928, an embodiment of the method may include forming base epitaxial layers 230, according to an embodiment. In an embodiment, the first base region 232 may be formed using selective epitaxial growth over the exposed surface of collector region 220. In an embodiment, CVD or MOCVD may be used to epitaxially grow the first base region using selective epitaxial growth. In an embodiment, the selective epitaxial growth may be facilitated by allowing the epitaxial material to only nucleate on the exposed semiconductor regions (e.g., the collector region 220 and/or selectively implanted collector 224). The epitaxial material will not nucleate on and grow over the surrounding insulator areas. In an embodiment, the first base region 232 may be formed on the exposed collector region surface and fill the base cavity 966 to the extent that the commensurate portion of dielectric region 214 has been removed. In an embodiment, the second base region 234 may be formed over the first base region 232 using similar selective epitaxial growth techniques as for forming the first base region 232.

Referring to FIG. 9C, blocks 930, 932, an embodiment of the method may include forming first and second inside spacer layers 970, 972, and etching them to form first and second inside spacer layers 263, 264 according to an embodiment. First and second inside spacer layers 970, 972 may be formed by depositing dielectric layers inside the emitter window 960 and utilizing anisotropic vertical etching to remove the dielectric over the base region 230 while leaving the dielectric layers on the sidewalls of the emitter window 960. In an embodiment, the first emitter spacer 263 (described previously) may include, e.g., TEOS and the second emitter spacer 264 may include, e.g., SiN, though other materials may be used.

Referring to FIG. 9C, block 934, an embodiment of the method may include forming emitter region layers 980 to form emitter region 260, according to an embodiment. Following spacer formation, the intrinsic emitter region 262 may be formed. In an embodiment, CVD or MOCVD may be used to epitaxially grow the intrinsic emitter layer 980 over base region 230 and extrinsic base dielectric layer 255 using selective epitaxial growth.

Referring to FIG. 9C, block 936, an embodiment of the method may include patterning emitter region layer 980 and forming emitter contact area 268, base contact area 238, and collector contact area 228 (not shown), according to an embodiment. In an embodiment, opening 984 may be etched in the intrinsic emitter layer 980 and base dielectric layer to expose extrinsic base 250. Base contact layer 238 and emitter contact layer 268 may be formed using, e.g., a silicide process, over extrinsic base 250, according to an embodiment. Collector contact area 228 and collector contact 229 may be formed at the same time as base and collector contact areas and contacts 238, 268 and 259, 269 (not shown). Following this, other processing may follow, depending on the device application and requirements (not shown).

Referring to FIG. 9C, block 938, an embodiment of the method may include forming emitter contact 269, base contact 259, and collector contact 229, according to an embodiment. In an embodiment, emitter and base electrodes 269 and 259, may be formed over base contact layer 258 and emitter contact layer 268, according to an embodiment. In an embodiment, emitter and base electrodes 259, 269 may be formed using, e.g., Ti/TiN/W metallization deposited by, e.g., CVD.

Figure 10A:
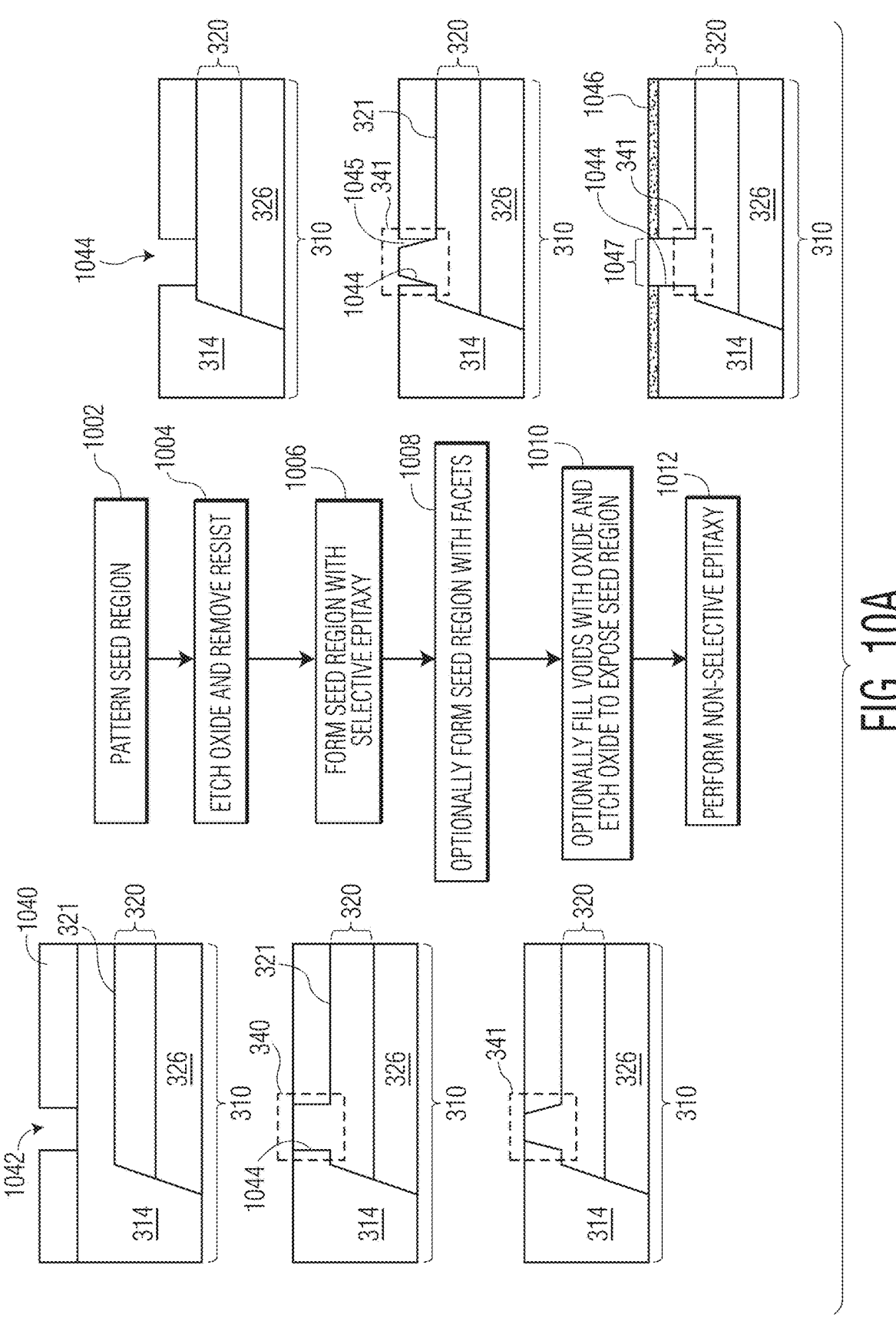
FIGS. 10A and 10B are a process flow diagrams with corresponding cross-sectional views describing a method for fabricating the semiconductor devices, in accordance with an embodiment of FIGS. 3A and 3B.
Figure 10B:
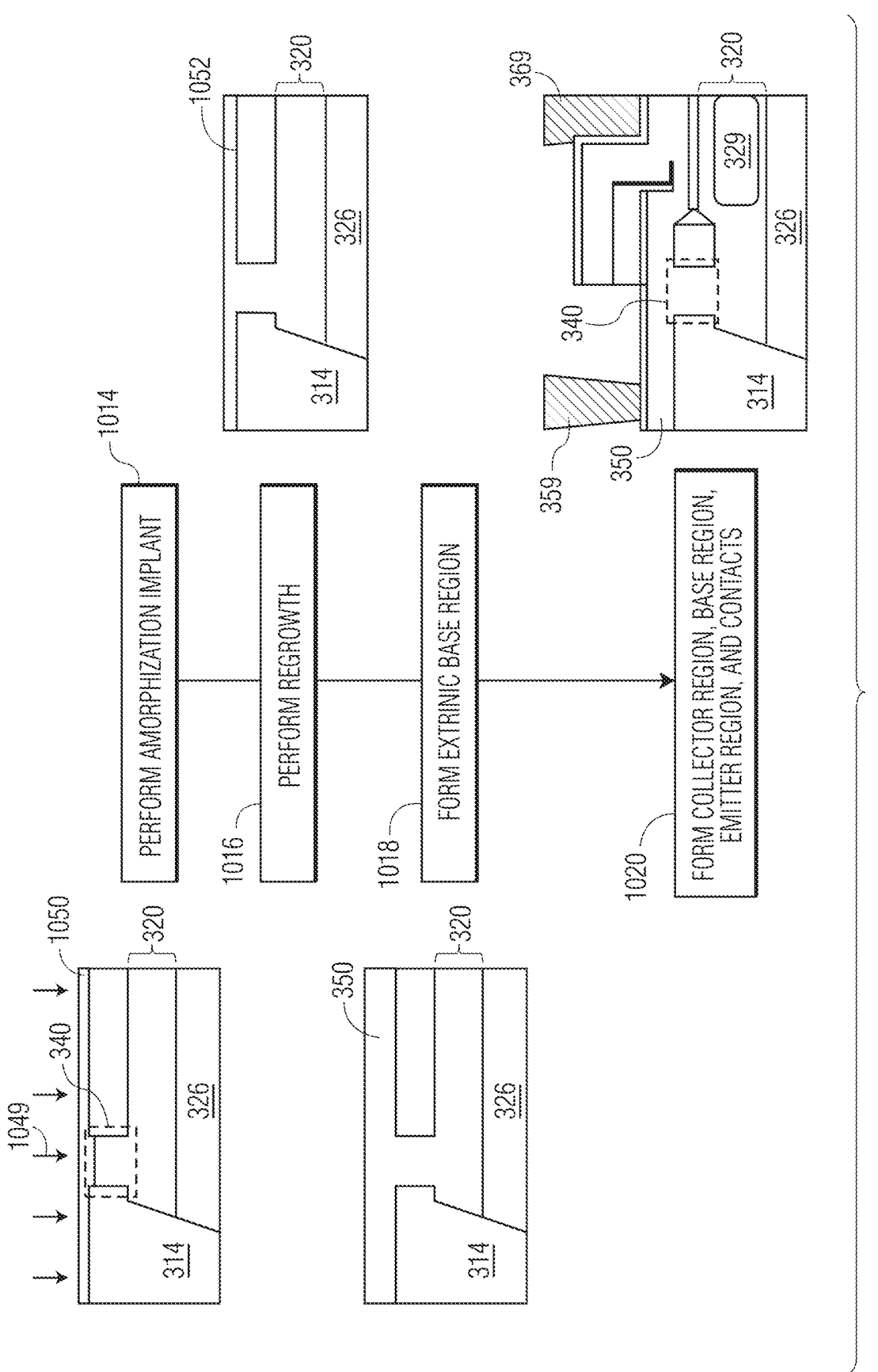

FIGS. 10A and 10B are process flow diagrams with corresponding cross sectional side views, detailing partial formation of an area 10 of FIGS. 3A and 3B, and describing a method for fabricating the bipolar transistors devices 300, 302 of FIGS. 3A and 3B, in accordance with an embodiment. In this description, the full fabrication sequence of the devices 300 and 302 of FIGS. 3A and 3B is given. As these fabrication steps are analogous to the formation of bipolar device 200 of FIG. 2, details of only the salient steps that differ from the process steps of FIGS. 9A, 9B, and 9C will be described here. Also, optional steps that may be undertaken to arrive at the embodiments of bipolar devices 400, 500, 600, 700, 800, in FIGS. 4, 5, 6, 7, and 8 have been described above in connection with FIGS. 9A, 9B, and 9C. While these descriptions have omitted for the sake of brevity, one of skill in the art will appreciate that the partial formation steps given in connection with the fabrication of bipolar devices 300, 302 in FIGS. 10A and 10B may be adapted to arrive at bipolar devices 400, 500, 600, 700, and 800.

Referring to FIG. 10A, in blocks 1002-1004, the method may include forming a collector region 320 within a semiconductor substrate 310, forming a sub-collector region 326, forming a dielectric region 314 adjacent the collector region 320, and forming an opening in the dielectric region 1044 over the substrate 310, according to an embodiment. In an embodiment, a resist layer 1040 may be patterned with opening 1042, and then opening 1044 may be etched in dielectric region 314.

Referring to FIG. 10A, in block 1006, an embodiment of the method may include forming a selective epitaxial layer to form seed region 340 within the opening 1044. According to an embodiment of the method, the seed region may include a single crystal (e.g., Si) formed within the opening 1044 where it contacts the upper surface 321 of the collector region 320. In an embodiment, the thickness of seed region 340 formed using selective epitaxy may be between about 500 angstroms and about 600 angstroms. In other embodiments, the thickness of seed region 340 may be between about 30 angstroms and about 2000 angstroms, though other smaller or larger thicknesses may be used. In an embodiment, one or more of chemical vapor phase deposition (CVD), metal-organic vapor phase deposition (MOCVD), molecular beam epitaxy (MBE) or other suitable techniques may be used to form selective epitaxial layer 946. In an embodiment, selective epitaxy may include an etchant such as hydrochloric acid which etches the deposited Si during nucleation. The process may be tuned so that the over Si regions, the etch rate may be lower than the nucleation rate, resulting in growth over Si, according to an embodiment. In oxide/nitride regions, the etch rate may be higher than the nucleation rate so that Si is not grown in these regions, according to an embodiment.

Referring to FIG. 10A, in block 1008, an embodiment of the method may optionally include forming faceted seed region 341 using a selective epitaxy within the opening 1044. According to an embodiment of the method, the seed region may include a single crystal (e.g., Si) formed within the opening 1044 where it contacts the upper surface 321 of the collector region 320. In an embodiment, the thickness of seed region 341 formed using selective epitaxy may be between about 500 angstroms and about 600 angstroms. In other embodiments, the thickness of faceted seed region 341 may be between about 300 angstroms and about 2000 angstroms, though other smaller or larger thicknesses may be used. Voids 1045 may form between the faceted seed region 341 and the sidewalls of opening 1044, according to an embodiment. In an embodiment, one or more of chemical vapor phase deposition (CVD), metal-organic vapor phase deposition (MOCVD), molecular beam epitaxy (MBE) or other suitable techniques may be used to form faceted seed region 341 using selective epitaxy.

Referring to FIG. 10A, in block 1010, an embodiment of the method may optionally include optionally filling voids 1045 between faceted seed region 341 and the opening 1044. The voids 1045 may be filled with silicon dioxide, silicon nitride or another suitable dielectric, according to an embodiment. In an embodiment the material (e.g., $SiO_2$ or TEOS) may be deposited using the same deposition technique as used to form the dielectric region 214 as in FIG. 9A, block 902. The dielectric formed over the top of faceted seed region 341 may be etched away using suitable etch techniques (e.g., RIE or ICP) to expose the top of faceted seed region 341.

Referring to FIG. 10A, in block 1012, an embodiment of the method may include forming a non-selective epitaxial layer 1046 over dielectric region 314 and within the opening 944 to partially form the seed region 340. According to an embodiment of the method, a region 1047 of the non-selective epitaxial layer 1046 may include single crystal (e.g., Si) formed over the seed region 340 within the opening 1044. On the other hand, the portions of non-selective epitaxial layer 1046 outside the region 1047 may be polycrystalline (e.g., poly Si). In an embodiment, the thickness of non-selective epitaxial layer 1046 may be between about 200 angstroms and about 600 angstroms. In other embodiments, the thickness of non-selective epitaxial layer 1046 may be between about 20 angstroms and about 2000 angstroms, though other smaller or larger thicknesses may be used for non-selective epitaxial layer 1046. In an embodiment, one or more of chemical vapor phase deposition (CVD), metal-organic vapor phase deposition (MOCVD), molecular beam epitaxy (MBE) or other suitable techniques may be used to form non-selective epitaxial layer 1046.

Referring to FIG. 10B, in block 1014, an embodiment of the method may include performing an amorphizing implant 1049 of a non-selective epitaxial layer 1046 to form amorphous layer 1050. In an embodiment, performing the amorphizing implant 1049 may include implanting Ge or other suitable species such as Ar, Xe, Si into the non-selective epitaxial layer 1046. The amorphizing implant 1049 may include a dose of between about $1e14\ cm^{-2}$ and $1e16\ cm^{-2}$ at an energy of between about 10 keV and about 30 keV, according to an embodiment.

Referring to FIG. 10B, block 1016, an embodiment of the method may include using solid-phase regrowth to convert the amorphous layer 1050 to a single crystal layer 1052. In an embodiment, the solid phase regrowth may include heating the amorphous layer 1050 to a temperature of between 500 degrees Celsius and 700 degrees Celsius with an ambient condition that includes a pressure between about 1 milli Torr and 800 Torr. The time needed to convert the amorphous layer 1050 to single crystal layer 1052 may be between about 1 minute and 20 hours, depending on the temperature used, according to an embodiment. In other embodiments, a laser melt process may be used to accomplish the solid-phase regrowth wherein laser energy is scanned over the wafer and heats the amorphous layer 1050 to convert it to single crystal layer 1052.

Referring to FIG. 10B, blocks 1018-1020, an embodiment of the method for forming bipolar transistors 300, 302, may include forming extrinsic base region 350, selectively implanted collector 324, base region 330, emitter region 360, base contacts 359 and emitter contact 369. The steps for forming extrinsic base region 350, selectively implanted collector 324, base region 330, emitter region 360, base contacts 359 and emitter contact 369 are analogous to the steps for forming selectively extrinsic base region 250, implanted collector 224, base region 230, emitter region 260, base contacts 259 and emitter contact 269 in FIGS. 9A, 9B, and 9C and are not repeated here for the sake of brevity.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary, or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
a semiconductor substrate;
a collector region formed within the semiconductor substrate in a first semiconductor region, having an upper surface and a collector sidewall;
a base region, disposed over the collector region;
a seed region formed over the semiconductor substrate and coupled to the semiconductor substrate outside the base region, wherein a proximal portion of the seed region directly contacts an upper surface of a monocrystalline portion of the semiconductor substrate, wherein the proximal portion of the seed region in contact with the semiconductor substrate has a first length and a distal portion of the seed region directly over the proximal portion has a second length, wherein the first length is less than the second length;

a dielectric region formed over at least a portion of the first semiconductor region and over a portion the collector sidewall, wherein a portion of the dielectric region separates the base region from the seed region;

an extrinsic base region having an upper surface and formed over and coupled to the distal portion of the seed region and electrically coupled to the base region; and an emitter region formed over the base region.

2. The semiconductor device of claim 1, wherein at least a portion of the extrinsic base region includes a monocrystalline material.

3. The semiconductor device of claim 2, wherein at least a portion of the extrinsic base region includes silicon germanium.

4. The semiconductor device of claim 1, wherein the seed region is formed in the first semiconductor region.

5. The semiconductor device of claim 1, wherein the proximal portion of the seed region in contact with the semiconductor substrate has a first length and a distal portion of the seed region directly over the proximal portion has a second length, and wherein the first length is more than ten percent larger than the second length.

6. The semiconductor device of claim 1, wherein the proximal portion of the seed region in contact with the semiconductor substrate has a first length and a distal portion of the seed region directly over the proximal portion has a second length, and wherein a magnitude of a difference between the first length and the second length is less than ten percent of the first length.

7. The semiconductor device of claim 1, wherein a sidewall of the seed region is coupled to the base region in a base-seed coupling region.

8. The semiconductor device of claim 1, wherein the seed region is formed in a second semiconductor region, and wherein a second isolation region is formed between the collector sidewall and the second semiconductor region.

9. The semiconductor device of claim 1, wherein the dielectric region includes a plurality of dielectric layers.

10. The semiconductor device of claim 1, further comprising a lateral link region formed between the extrinsic base region and the base region, wherein the lateral link region includes a base link portion that is coupled to a sidewall of the extrinsic base region and to a portion of the base region.

11. The semiconductor device of claim 9, further comprising an opening formed between the extrinsic base region and the seed region.

12. A bipolar transistor device comprising:

a semiconductor substrate;

a first isolation region formed within the semiconductor substrate;

a collector region formed laterally adjacent the first isolation region within the semiconductor substrate in a first semiconductor region, having an upper surface and a collector sidewall;

a base region disposed over the collector region;

a dielectric region formed over at least a portion of the semiconductor substrate and over the collector sidewall;

a seed region formed over the semiconductor substrate within a seed opening in the dielectric region and coupled to the semiconductor substrate outside the base region, wherein a proximal portion of the seed region directly contacts an upper surface of a monocrystalline portion of the semiconductor substrate, wherein the proximal portion of the seed region in contact with the semiconductor substrate has a first length and a distal portion of the seed region directly over the proximal portion has a second length, wherein the first length is less than the second length, wherein a portion of the dielectric region separates the base region from the seed region;

an extrinsic base region formed over the seed region, the extrinsic base region having a first portion formed between and laterally adjacent the distal portion of the seed region and the base region, wherein at least a portion of the extrinsic base region is monocrystalline and wherein a monocrystalline portion of the extrinsic base is electrically coupled to the base region; and an emitter region formed over the base region.

13. The bipolar transistor device of claim 12, wherein a sidewall of the seed region is coupled to the base region.

14. The bipolar transistor device of claim 12, wherein the seed region is formed in a second semiconductor region, and wherein a second isolation region is formed between the collector sidewall and the second semiconductor region.

15. The bipolar transistor device of claim 12, further comprising a lateral link region formed between the extrinsic base region and the base region, wherein the lateral link region includes a base link portion that is coupled to a sidewall of the extrinsic base region and to a portion of the base region.

16. A method of forming a bipolar transistor device, the method comprising:

forming a semiconductor substrate;

forming an isolation region within the semiconductor substrate;

forming a collector region laterally adjacent the isolation region within the semiconductor substrate in a first semiconductor region, wherein the collector region includes an upper surface and a collector sidewall;

forming a base region over the collector region;

forming a dielectric region over at least a portion of the semiconductor substrate and over the collector sidewall;

forming a seed region over the semiconductor substrate within a seed opening in the dielectric region and coupled to the semiconductor substrate outside the base region, wherein a proximal portion of the seed region directly contacts an upper surface of a monocrystalline portion of the semiconductor substrate, and wherein the proximal portion of the seed region in contact with the semiconductor substrate has a first length and a distal portion of the seed region directly over the proximal portion has a second length, wherein the first length is less than the second length, wherein a portion of the dielectric region separates the base region from the seed region;

forming an extrinsic base region over and coupled to the distal portion of the seed region having a first portion formed between and laterally adjacent the seed region and the base region, wherein at least a portion of the extrinsic base region is monocrystalline; and forming an emitter region over the base region.

17. The method of claim 16, wherein forming the seed region includes non-selective epitaxy.

18. The method of claim 16, wherein forming the seed region includes selective epitaxy.

* * * * *